US008395258B2

(12) United States Patent
Ikeda

(10) Patent No.: US 8,395,258 B2
(45) Date of Patent: Mar. 12, 2013

(54) SEMICONDUCTOR ELEMENT, SEMICONDUCTOR DEVICE, AND FABRICATION METHOD THEREOF

(75) Inventor: Junichi Ikeda, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 953 days.

(21) Appl. No.: 12/339,150

(22) Filed: Dec. 19, 2008

(65) Prior Publication Data

US 2009/0160066 A1 Jun. 25, 2009

(30) Foreign Application Priority Data

Dec. 21, 2007 (JP) ................................. 2007-329476

(51) Int. Cl.
*H01L 23/482* (2006.01)
(52) U.S. Cl. ........ 257/734; 257/736; 257/750; 257/758; 257/773; 257/778; 257/786; 257/E23.141; 257/E23.142; 257/E23.151
(58) Field of Classification Search .................. 257/734, 257/736, 750, 758, 773, 778, 786, E23.141, 257/E23.142, E23.151
See application file for complete search history.

(56) References Cited

U.S. PATENT DOCUMENTS

| 5,739,587 A * | 4/1998 | Sato ............................... 257/758 |
| 6,534,853 B2 * | 3/2003 | Liu et al. ....................... 257/692 |
| 6,921,714 B2 * | 7/2005 | Yamaha .......................... 438/612 |
| 2003/0102551 A1 * | 6/2003 | Kikuchi ........................ 257/701 |
| 2003/0109079 A1 | 6/2003 | Yamaguchi et al. |
| 2005/0017355 A1 * | 1/2005 | Chou et al. ..................... 257/738 |
| 2005/0139981 A1 * | 6/2005 | Kobayashi et al. ........... 257/690 |
| 2007/0075424 A1 | 4/2007 | Nakanishi et al. |

FOREIGN PATENT DOCUMENTS

| JP | 2003-174118 | 6/2003 |
| JP | 2003174118 A | 6/2003 |
| JP | 2007103539 A | 4/2007 |
| JP | 2007-329476 | 12/2007 |

OTHER PUBLICATIONS

Official Notice of Reason for Rejection, Japanese Patent Office, 2007 Patent Application No. 329476, Jul. 26, 2011 with English Excerpt Translation.

* cited by examiner

*Primary Examiner* — Peniel M Gumedzoe
(74) *Attorney, Agent, or Firm* — Taft Stettinius & Hollister LLP

(57) ABSTRACT

Semiconductor elements and methods for fabricating semiconductor elements that allow semiconductor elements having the same function to utilize different packaging methods. An exemplary semiconductor element includes a first semiconductor element portion, including an internal circuit, electrodes electrically connected to the internal circuit, and a first insulating layer covering the internal circuit while exposing the electrodes; and a second semiconductor element portion electrically connected to the electrodes and formed on the first insulating layer, the second semiconductor element portion including a wiring layer having a first pad and a second pad, and a second insulating layer configured to cover either one of the first pad or the second pad while exposing the other one of the first pad and the second pad.

13 Claims, 20 Drawing Sheets

SEMICONDUCTOR ELEMENT, SEMICONDUCTOR DEVICE, AND FABRICATION METHOD THEREOF

CROSS REFERENCE TO RELATED APPLICATION

This application claims the benefit of Japanese Patent Application No. 2007-329476, filed Dec. 21, 2007, which is incorporated by reference.

BACKGROUND

The present disclosure relates to semiconductor elements and fabrication methods for semiconductor elements, and, more particularly, to semiconductor elements capable of being utilized in a variety of different packaging methods and methods of fabricating the same.

Conventional methods of packaging semiconductor elements include mounting a semiconductor element on a mounting substrate in a face-down manner (i.e., such that a surface including electrodes is towards to the mounting substrate) as well as mounting a semiconductor such that the electrode surface is not towards to the mounting substrate.

An example of the former packaging method includes a flip-chip packaging method where bumps are formed in the electrodes of a semiconductor element. The electrodes of the semiconductor element are directly connected to the electrodes of a mounting substrate. Another example is a chip scale package ("CSP") packaging method, where posts electrically connected to the electrodes of a semiconductor element are formed covering an element surface of the semiconductor element, a sealing resin is applied while leaving the posts exposed, and solder balls or the like are formed on the posts, so that the posts are connected to the electrodes of a mounting substrate.

An example of the latter packaging method includes a lead frame packaging method in which a semiconductor element is mounted on a lead frame so that a surface opposite an electrode surface is towards to the lead frame, the electrodes of the semiconductor element are electrically connected to lead terminals of the lead frame using wire bonding, and a sealing resin is formed to cover the entire surface of the semiconductor element mounted on the lead frame. Another example includes a chip on board ("COB") packaging method where a semiconductor element is mounted on a mounting substrate so that a surface opposite an electrode surface is towards the mounting substrate, and the electrodes of the semiconductor element and the electrodes of the mounting substrate are electrically connected by means of wire bonding or by forming a wiring layer.

In ball grid array ("BGA") packaging where a semiconductor element is mounted on an interposer so that the electrodes of the semiconductor element are electrically connected to solder balls (or the like) arranged on a mounting surface of the interposer, the semiconductor element may be applied using either the former or the later packaging method. In addition, in the lead frame packaging method, the semiconductor element may be connected to the lead terminal by means of a flip-chip connection.

Although there are a variety of types of packaging methods, an appropriate packaging method is selected depending on a function, a purpose of use, or the like of the semiconductor element, and a position or the like of the terminals is appropriately designed in accordance with the number or the position of the electrodes of the mounting substrate.

In addition, Japanese Laid-Open Patent Application No. 2003-174118 discloses a technique that enables changing the position of a pad in a simple manner, even after the position of the pad has been designed in a water-level chip scale package ("WLCSP").

Semiconductor elements including a circuit for measuring temperature or time, a sensor such as a speed sensor, an acceleration sensor or a pressure sensor, or the like are used for a variety of purposes, and even semiconductor elements having the same function may utilize a variety of packaging methods.

However, in the above-described conventional techniques, the semiconductor element is usually designed to be used with only one packaging method, and the semiconductor element typically needs to be redesigned to be used with another packaging method, resulting in an increase in time or cost.

Moreover, in the technique disclosed in Japanese Laid-Open Patent Application No. 2003-174118, the pad position may changed for only one packaging method but cannot be changed for another packaging method.

Introduction

Exemplary embodiments include semiconductor elements and methods for fabricating semiconductor elements that allow semiconductor elements having the same function to utilize different packaging methods. An exemplary semiconductor element includes a first semiconductor element portion including an internal circuit, electrodes electrically connected to the internal circuit, and a first insulating layer covering the internal circuit while exposing the electrodes; and a second semiconductor element portion electrically connected to the electrodes and formed on the first insulating layer, the second semiconductor element portion including a wiring layer having a first pad and a second pad, and a second insulating layer configured to cover either one of the first pad or the second pad while exposing the other one of the first pad and the second pad.

In an aspect, a semiconductor element may include a first semiconductor element portion including an internal circuit, electrodes electrically connected to the internal circuit, and a first insulating layer covering the internal circuit and exposing the electrodes; and a second semiconductor element portion electrically connected to the electrodes and formed over the first insulating layer, the second semiconductor element portion including a wiring layer having a first pad and a second pad, and a second insulating layer covering one of the first pad and the second pad while exposing the other of the first pad and the second pad.

In a detailed embodiment, the first pad and the second pad may be formed on an upper surface of the first insulating layer, and the second pad may be disposed closer to an inner portion of the semiconductor element than the first pad. In a further detailed embodiment, the second pad may be disposed above the internal circuit. In yet a further detailed embodiment, the first pad may be located near at least one edge of the semiconductor element.

In another detailed embodiment, the second pad may be disposed above the internal circuit. In another detailed embodiment, the first pad may be located near at least one edge of the semiconductor element. In another detailed embodiment, the second insulating layer may expose the first pad and may cover the second pad, and the semiconductor element may be adapted for a wire bonding packaging method. In another detailed embodiment, the second insulating layer may expose the second pad and may cover the first pad, and the semiconductor element may be adapted for a chip scale packaging method.

In another aspect, a semiconductor device may include a first semiconductor element portion including an internal circuit, electrodes electrically connected to the internal circuit, and a first insulating layer covering the internal circuit while exposing the electrodes; a second semiconductor element portion electrically connected to the electrodes and formed over the first insulating layer, the second semiconductor element portion including a wiring layer having a first pad and a second pad, and a second insulating layer covering one of the first pad and the second pad while exposing the other of the first pad and the second pad; a semiconductor device portion on the second insulating layer including a rewiring layer connected to the exposed first pad or second pad, a post formed on the rewiring layer electrically connected to the rewiring layer, and a sealing layer formed on the second insulating layer exposing at least a portion of the post.

In a detailed embodiment, the first pad and the second pad may be formed on an upper surface of the first insulating layer, and the second pad may be disposed closer to an inner portion of the semiconductor element than the first pad. In a further detailed embodiment, the second pad may be disposed above the internal circuit. In yet a further detailed embodiment, the first pad may be located near at least one edge of the semiconductor device. In still a further detailed embodiment, the wiring layer may include a connection portion connecting the first pad and the second pad; the rewiring layer may include a pad connection region connected to the first pad, a connection region connected to the pad connection region, and a post forming region connected to the connection region; and the wiring layer and the rewiring layer electrically connected to the first pad used for inputting or outputting a data signal may be designed such that a length of the connection region of the rewiring layer is shorter than a length of the connection portion of the wiring layer. In another further detailed embodiment, the wiring layer may include a connection portion for connecting the first pad and the second pad; the rewiring layer may include a pad connection region connected to the first pad, a connection region connected to the pad connection region, and a post forming region connected to the connection region; and the wiring layer and the rewiring layer electrically connected to the first pad used for the supply of a source voltage or a ground voltage may be designed such that a length of the connection region of the rewiring layer is longer than a length of the connection portion of the wiring layer. In another further detailed embodiment, a plurality of posts may be regularly arranged along a periphery of the semiconductor device, and the first pad and the second pad may be disposed on an imaginary straight line connecting ends of posts arranged along one side of the semiconductor device or inward of the imaginary straight line.

In another detailed embodiment, the second pad may be disposed above the internal circuit. In another detailed embodiment, the first pad may be located near at least one edge of the semiconductor device.

In another detailed embodiment, the wiring layer may include a connection portion connecting the first pad and the second pad; the rewiring layer may include a pad connection region connected to the first pad, a connection region connected to the pad connection region, and a post forming region connected to the connection region; and the wiring layer and the rewiring layer electrically connected to the first pad used for inputting or outputting a data signal may be designed such that a length of the connection region of the rewiring layer is shorter than a length of the connection portion of the wiring layer.

In another detailed embodiment, the wiring layer may include a connection portion for connecting the first pad and the second pad; the rewiring layer may include a pad connection region connected to the first pad, a connection region connected to the pad connection region, and a post forming region connected to the connection region; and the wiring layer and the rewiring layer electrically connected to the first pad used for the supply of a source voltage or a ground voltage may be designed such that a length of the connection region of the rewiring layer is longer than a length of the connection portion of the wiring layer.

In another detailed embodiment, a plurality of posts may be regularly arranged along a periphery of the semiconductor device, and the first pad and the second pad may be disposed on an imaginary straight line connecting ends of posts arranged along one side of the semiconductor device or inward from the imaginary straight line. In another detailed embodiment, the second insulating layer may expose the first pad and covers the second pad, and the semiconductor device may be adapted for a wire bonding packaging method. In another detailed embodiment, the second insulating layer may expose the second pad and covers the first pad, and the semiconductor device may be adapted for a chip scale packaging method.

In another aspect, a method of fabricating a semiconductor element may include preparing a semiconductor substrate including an internal circuit, electrodes electrically connected to the internal circuit, and a first insulating layer covering the internal circuit while exposing the electrodes; forming a wiring layer including a first pad and a second pad over the first insulating layer, the first pad and the second pad being electrically connected to the electrodes; and forming a second insulating layer over the semiconductor substrate exposing one of the first pad and the second pad in accordance with an intended packaging method.

In an detailed embodiment, the step of forming the second insulating layer may include exposing the first pad and an intended packaging method may include wire bonding. In another detailed embodiment, the step of forming the second insulating layer may include exposing the second pad and an intended packaging method may include chip scale packaging. In another detailed embodiment, the method may include forming rewiring layer over the second insulating layer, the rewiring layer being connected to the pad; forming a post on the rewiring layer; forming a sealing resin over the semiconductor element exposing the post; and forming an external terminal on the post.

In another detailed embodiment, the step of forming the second insulating layer may include applying a second insulating material over the semiconductor substrate, and etching the second insulating material using one of a first photomask exposing the first pad and a second photomask exposing the second pad. In a further detailed embodiment, the step of etching the second insulating material may include selecting between the first photomask and the second photomask based on an intended packaging method. In yet a further detailed embodiment, the first photomask may be selected and the intended packaging method may be a wire bonding packaging method. In another further detailed embodiment, the second photomask may be selected and the intended packaging method may be a chip scale packaging method.

BRIEF DESCRIPTION OF THE DRAWINGS

The detailed description refers to the figures in which.

DETAILED DESCRIPTION

The present disclosure is made in view of the above-described problems and describes exemplary semiconductor elements and fabrication methods which allow semiconductor elements having the same function to use different packaging methods. An exemplary semiconductor element includes a first semiconductor element portion including an internal circuit, electrodes electrically connected to the internal circuit, and a first insulating layer covering the internal circuit while exposing the electrodes; and a second semiconductor element portion electrically connected to the electrodes and formed on the first insulating layer, the second semiconductor element portion including a wiring layer having a first pad and a second pad, and a second insulating layer covering either one of the first pad or the second pad while exposing the other of the first pad and the second pad.

Figure 1:
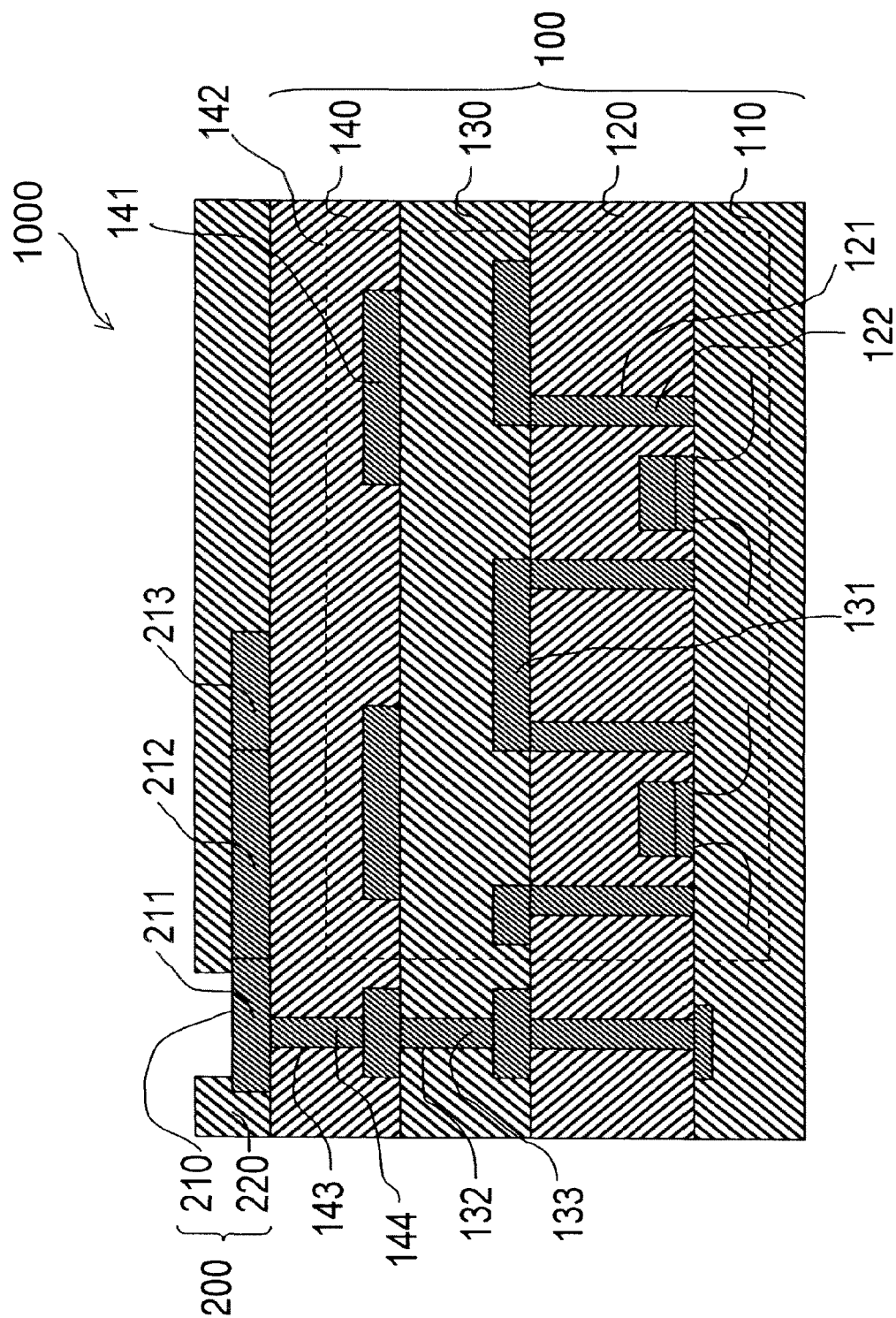
FIG. 1 is a cross-sectional view illustrating a semiconductor element according to a first exemplary embodiment.
Figure 2:
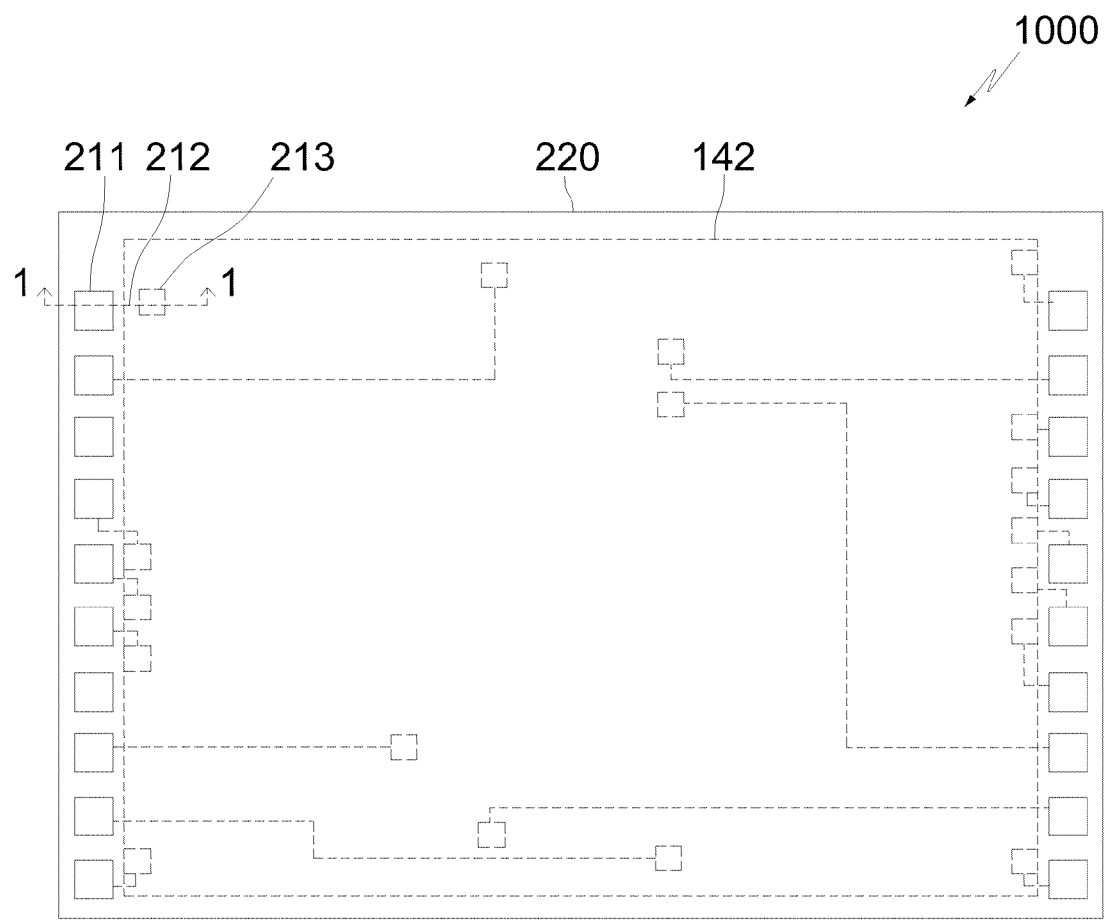
FIG. 2 is a plan view illustrating the exemplary semiconductor element of FIG. 1.

A description of an exemplary semiconductor element and a fabrication method thereof is provided with reference to FIGS. 1 to 8. FIG. 1 is a cross-sectional view illustrating a semiconductor element according to a first exemplary embodiment. FIG. 2 is a plan view illustrating the exemplary semiconductor element of FIG. 1, and the sectional view of FIG. 1 corresponds to a sectional view taken along the line 1-1 in FIG. 2.

In the exemplary embodiment, a semiconductor element 1000 includes a first semiconductor element portion 100 and a second semiconductor element portion 200. The first semiconductor element portion 100 includes a semiconductor layer 110, a first interlayer insulating film 120, a second interlayer insulating film 130, and a third interlayer insulating film 140.

In the exemplary embodiment, the semiconductor layer 110 is formed of silicon or a semiconductor material using a semiconductor compound such as gallium arsenide ("GaAs"). The semiconductor layer 110 may include one or more transistors, resistors, capacitors, and/or the like. In an embodiment, a silicon substrate is used, and a transistor, a resistor, a capacitor, and/or the like are formed on the silicon substrate.

In the exemplary embodiment, the first interlayer insulating film 120 is formed of a material such as silicon oxide, polyimide, or a low-k insulating material. The first interlayer insulating film 120 is formed on the semiconductor layer 110 covering the transistors, the resistors, the capacitors, and the like formed on the semiconductor layer 110. First contact holes 121 are formed in the first interlayer insulating film 120, and first contact electrodes 122 (which are electrically connected to the transistors, the resistors, the capacitors, and the like) are formed in the respective first contact holes 121. In an embodiment, the first interlayer insulating film 120 is formed of silicon oxide and has a thickness of about 280 nm to 350 nm, and each of the first contact holes 121 has a diameter of about 0.30 µm to 0.40 µm.

In the exemplary embodiment, the second interlayer insulating film 130 is formed on the first interlayer insulating film 120 covering first internal wirings 131 formed on the first interlayer insulating film 120. The first internal wirings 131 are connected to the transistors, the resistors, and the capacitors formed on the semiconductor layer 110 via the first contact electrodes 122. A second contact hole 132 is formed in the second interlayer insulating film 130 at a position where it is connected to the first internal wirings 131 or the first contact electrodes 122. A second contact electrode 133 is formed in the second contact hole 132 so as to be connected to the first internal wirings 131 or the first contact electrodes 122. In an embodiment, the second interlayer insulating film 130 is formed of the same material and has the same thickness as the first interlayer insulating film 120. In this embodiment, the second contact hole 132 has the same diameter as the first contact holes 121.

In the exemplary embodiment, the third interlayer insulating film 140 is formed of the same material as the first interlayer insulating film 120 and the second interlayer insulating film 130. The third interlayer insulating film 140 is formed on the second interlayer insulating film 130 covering second internal wirings 141 formed on the second interlayer insulating film 130. The second internal wirings 141 are electrically connected to the second contact electrode 133. In this way, an internal circuit 142 is formed by the transistors and the like formed on the semiconductor layer 110, the first contact electrodes 122, the first internal wirings 131, the second contact electrodes 133, and the second internal wirings 141. In the third interlayer insulating film 140, a third contact hole 143 and a third contact electrode 144 are formed, and the third contact electrode 144 is electrically connected the internal circuit 142. In an embodiment, the third interlayer insulating film 140 is formed of the same material as the first interlayer insulating film 120 and the second interlayer insulating film 130, and the third interlayer insulating film 140 has a thickness of about 380 nm to 450 nm. In this embodiment, the third contact hole 143 has the same diameter as the first contact holes 121 and the second contact hole 132.

In the exemplary embodiment, the third contact electrode 144 is connected to a pad which is connected to an external device, and the third contact electrode 144 is not connected to the internal circuit 142 via the third interlayer insulating film 140. In other words, the internal circuit 142 is constructed without internal wirings on the uppermost layer. The internal circuit 142 may be a circuit having a specific function such as an input/output circuit, or may be a circuit included in a system having an arithmetic circuit or a memory. The third contact electrode 144 may be connected to the second contact electrode 133 or the second internal wirings 141 as long as it is connected to a terminal for connection with an external device.

Although the internal circuit 142 of the exemplary embodiment is described as including two wiring layers, the internal circuit 142 may include three or more wiring layers. In such embodiments, the internal circuit may be designed to not include the internal wiring on the uppermost layer.

In the exemplary embodiment, the second semiconductor element portion 200 includes a wiring layer 210 and an insulating layer 220. The wiring layer 210 is formed on the third interlayer insulating film 140 of the first semiconductor element portion 100. The wiring layer 210 includes a first pad 211 formed on the third contact electrode 144, a connection portion 212 connected to the first pad 211, and a second pad 213 connected to the connection portion 212. The wiring layer 210 may be formed from aluminum, copper, and/or an alloy thereof, for example. In an embodiment, the wiring layer 210 is formed of an alloy of aluminum and copper and has a thickness of about 800 nm.

In the exemplary embodiment, the insulating layer 220 is formed of an insulating material such as polyimide. The insulating layer 220 is formed on the third interlayer insulating film 140 covering the wiring layer 210 while exposing the first pad 211 or the second pad 213 of the wiring layer 210. In FIG. 1, the first pad 211 is exposed while the connection portion 212 and the second pad 213 are covered by the insulating layer 220. In this manner, since the insulating layer 220 exposes the first pad 211 or the second pad 213 while covering the other, it is possible to prevent unintended connection to the pads and to prevent unexpected short-circuiting due to remaining metal particles.

FIG. 2 is a plan view illustrating the semiconductor element 1000 of the first exemplary embodiment. In FIG. 2, portions of the wiring layer 210 covered by the insulating layer 220 and the internal circuit 142 are illustrated by broken lines. As shown in FIG. 2, the first pad 211 is a pad for use in a wire bonding type packaging method and is formed on the third interlayer insulating film 140 along the periphery of the semiconductor element 1000. The second pad 213 is a pad for use in a CSP type packaging method and is disposed closer to an inner portion of the semiconductor element 1000 than the first pad 211.

In the exemplary embodiment, in the case of the CSP type packaging method, posts are formed, and, when forming the posts, post forming regions are formed at intervals larger those of the pads used for the wire bonding. Since the pad used for the wire bonding are not used in the CSP type packaging method, the wiring layer 210 includes two pads (i.e., the first pad 211 and the second pad 213) as described above. In an embodiment, the first pad 211 has a square shape of about 90 μm to 100 μm, as shown in FIG. 2, while the second pad 213 has a square shape smaller by about 25 μm than the first pad 211 (i.e., a square shape of about 65 μm to 75 μm). A portion of the first pad 211 exposed by the insulating layer 220 has a square shape of about 80 μm to 90 μm, or a portion the second pad 213 exposed by the insulating layer 220 has a square shape of about 55 μm to 65 μm. A central portion of the first pad 211 or the second pad 213 may be exposed in consideration of potential misalignment during a photolithography process.

In the exemplary embodiment, the second pad 213 is disposed above the internal circuit 142. This is because the internal circuit 142 includes the wiring layer beneath the wiring layer 210 (the uppermost layer of the internal wiring in this embodiment) as described above. Therefore, it is possible to dispose the second pad 213 in the wiring layer 210 (the uppermost wiring layer) above the internal circuit 142. Because the internal circuit 142 includes the wiring layer beneath the wiring layer 210 (the uppermost layer of the internal wiring), it is not necessary to locate the pads in consideration of the wirings of the internal circuit, and, thus, the pads can be located at arbitrary positions in a simple manner.

Although FIG. 2 illustrates an exemplary semiconductor element 1000 in which the first pads 211 are arranged along two opposite edges, the first pads 211 may be arranged along all edges, for example. Such as device may be used for a general-purpose product in which that the pads and the number of pads may be appropriately selected depending on the purpose of use or the specifications (such as digital input/output or analog input/output). In some embodiments, the first pad 211, the connection portion 212, and the second pad 213 are not necessarily formed for every wiring layers 210, and a wiring layer having all of the them and a wiring layer having, for example, a single pad may alternate with each other. In some embodiments, the first pads 211 may be arranged in a zigzag fashion near an edge, for example.

Figure 3:
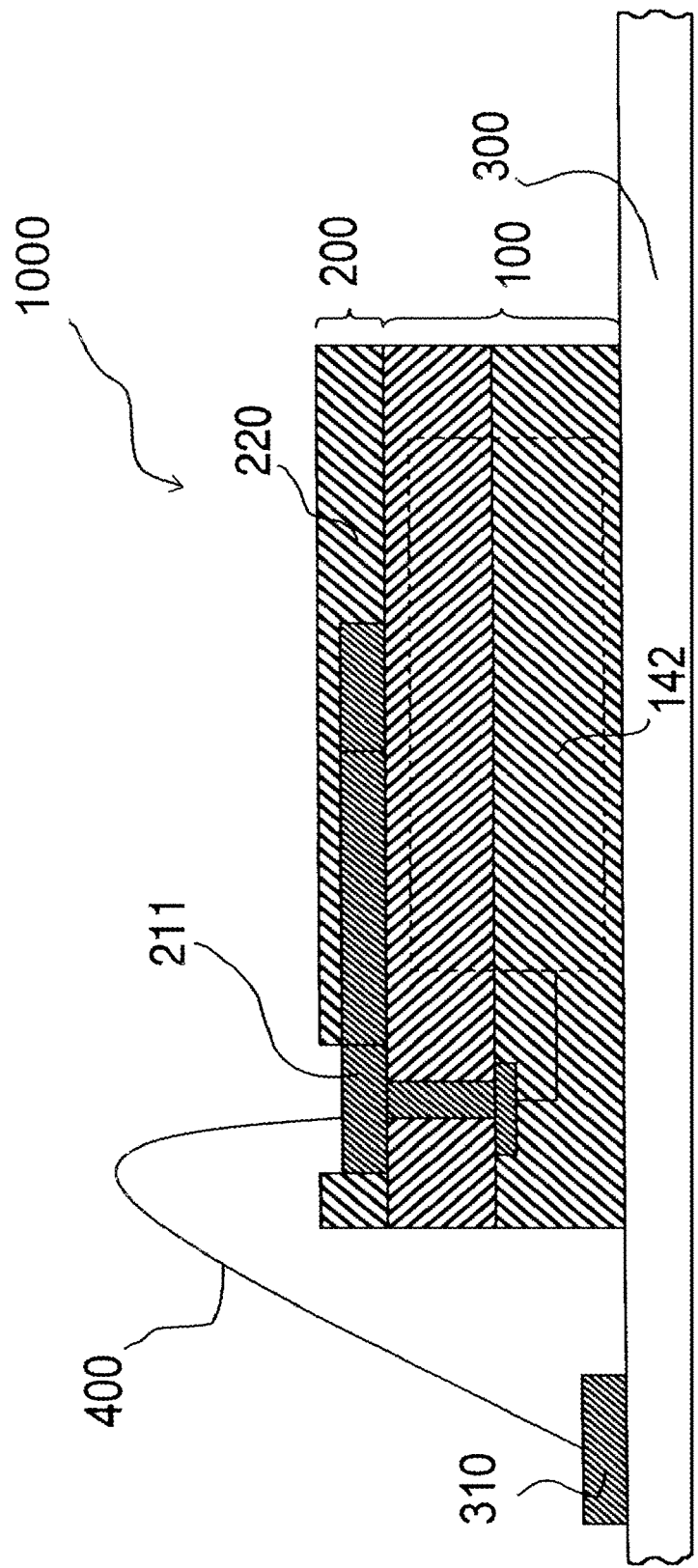
FIG. 3 is a cross-sectional view illustrating an exemplary packaging method of the exemplary semiconductor element of FIG. 1.

FIG. 3 illustrates an exemplary packaging method for the semiconductor element 1000 illustrated in FIG. 1. In FIG. 3, the semiconductor element 1000, a mounting substrate 300 for mounting the semiconductor element 1000, and a bonding wire 400 are illustrated. As discussed above, the semiconductor element 1000 includes the first semiconductor element portion 100 and the second semiconductor element portion 200.

In the exemplary method, the mounting substrate 300 is a substrate on which the semiconductor element 1000 is mounted, and the mounting substrate 300 includes an electrode 310 electrically connected to the first pad 211 of the semiconductor element 1000. Examples of the mounting substrate 300 include an interposer used for a BGA package, a die pad used for a lead frame package, a board used for a COB package, and the like. The electrode 310 corresponds to a lead terminal used for a lead frame package.

In the exemplary method, the bonding wire 400 is used for electrically connecting the first pad 211 of the semiconductor element 1000 to the electrode 310 of the mounting substrate 300, and is formed by a wire bonder. In a packaging method other than a lead frame package where a die pad and a lead terminal are separated from each other, instead of using the bonding wire 400, the first pad 211 may be connected to the electrode 310 by forming a wiring layer.

Figure 4:
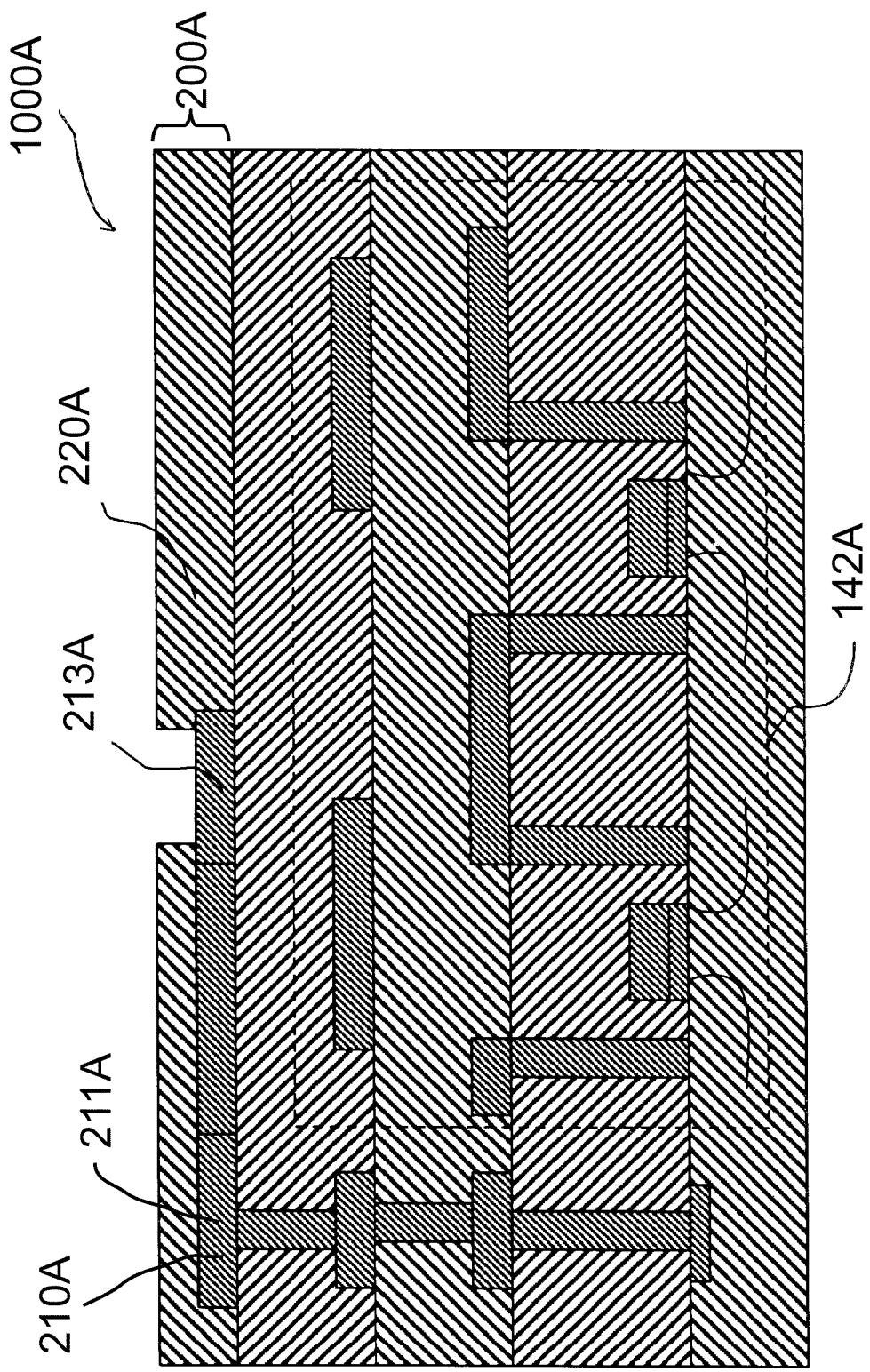
FIG. 4 is a cross-sectional view illustrating a second exemplary semiconductor element.
Figure 5:
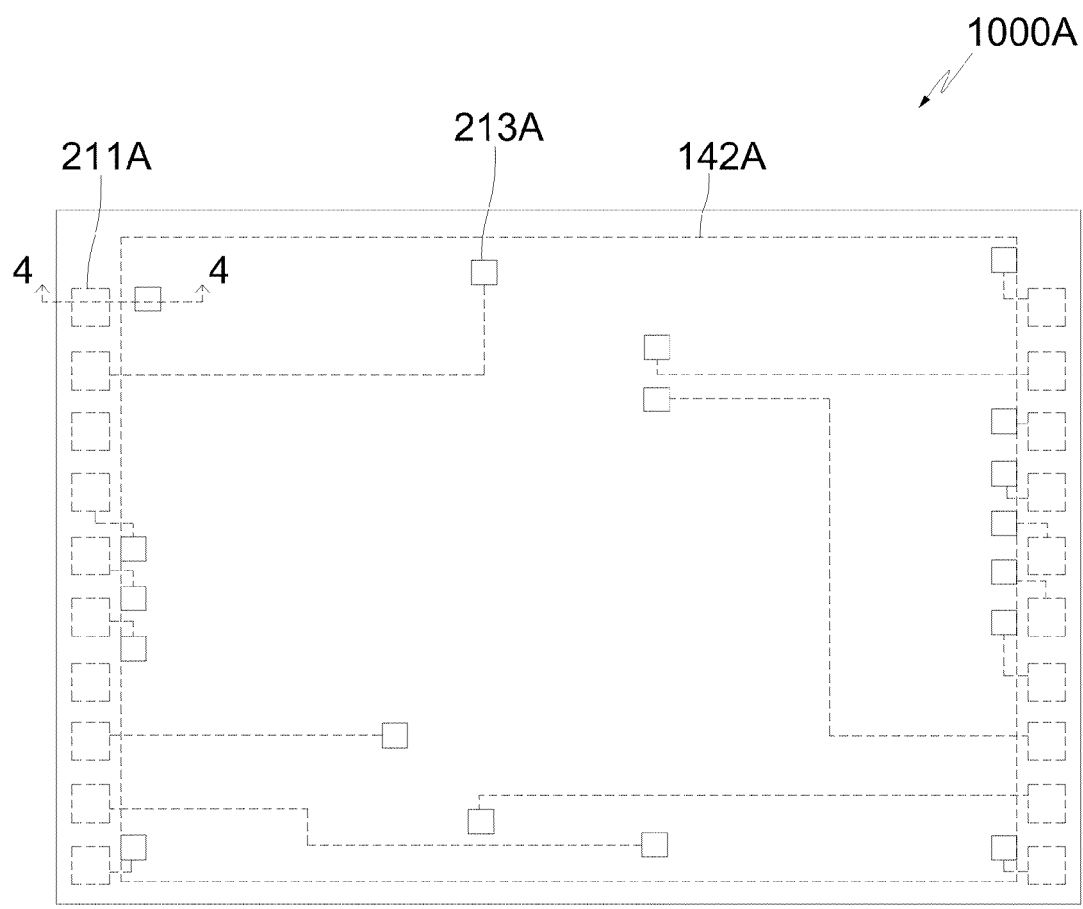
FIG. 5 is a plan view illustrating the second exemplary semiconductor element of FIG. 4.

FIG. 4 is a cross-sectional view illustrating an exemplary semiconductor element 1000A, which is different from the semiconductor element 1000 illustrated in FIG. 1 in that a different pad is exposed by the insulating layer 220A. FIG. 5 is a plan view illustrating the semiconductor element 1000A illustrated in FIG. 4. The sectional view of FIG. 4 corresponds to a sectional view taken along the line 4-4 in FIG. 5.

The insulating layer 220A of the exemplary semiconductor element 1000A illustrated in FIG. 4 is formed so as to expose the second pad 213A. The configurations of other portions are generally the same as those of the semiconductor element 1000 illustrated in FIG. 1. The semiconductor element 1000A illustrated in FIG. 4 is selected for use in a CSP type packaging method.

FIG. 5 is a plan view illustrating the exemplary semiconductor element 1000A illustrated in FIG. 4. Similar to FIG. 2, portions of the wiring layer covered by the insulating layer 220A and the internal circuit 142A are illustrated by broken lines. The configuration and position of the first pad 211A and the second pad 213A are generally the same as those described in connection with FIG. 2.

Figure 6:
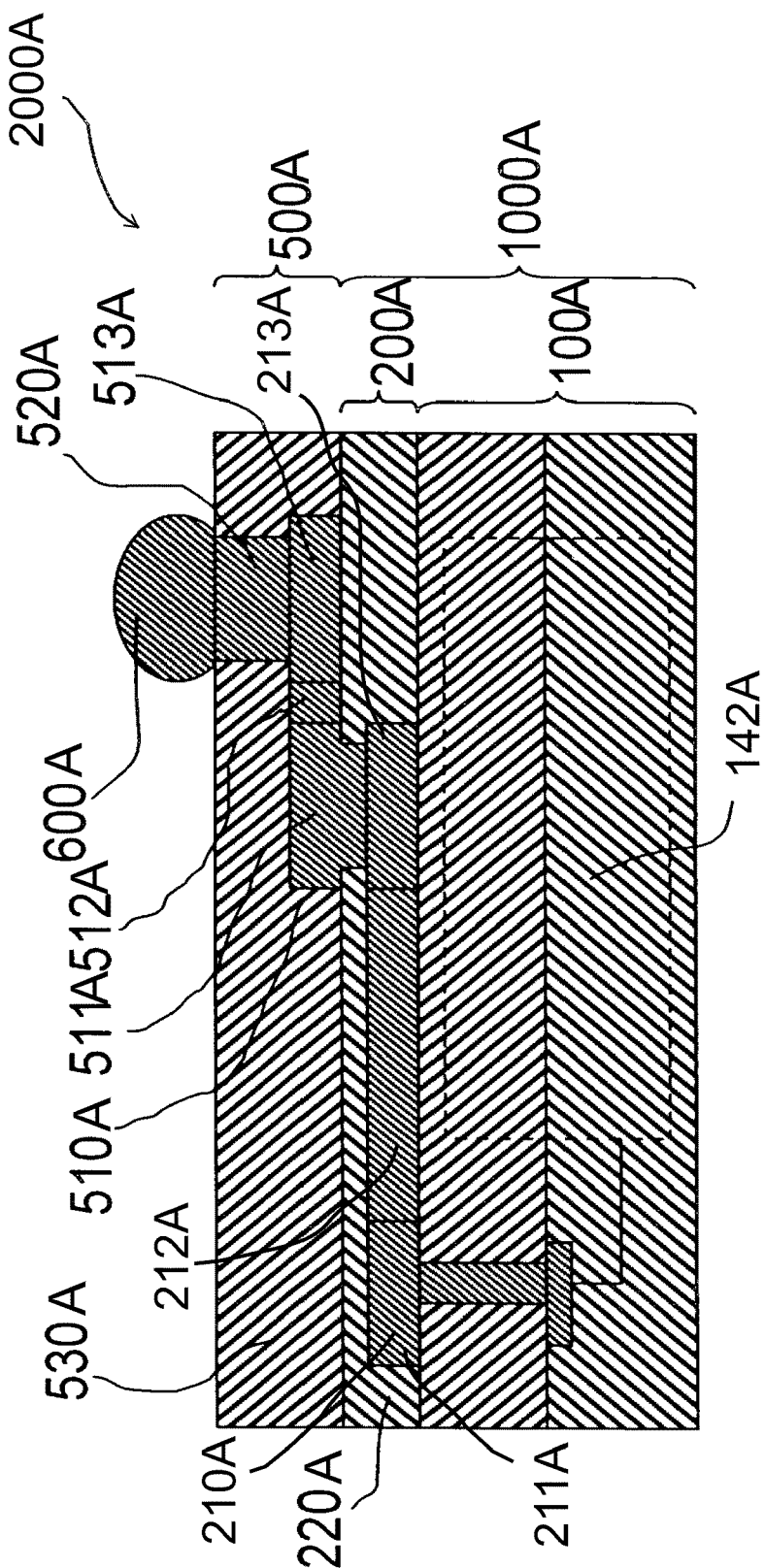
FIG. 6 is a cross-sectional view illustrating an exemplary semiconductor device 2000A packaged in accordance with a CSP type packaging method using the exemplary semiconductor element of FIG. 4.
Figure 7:
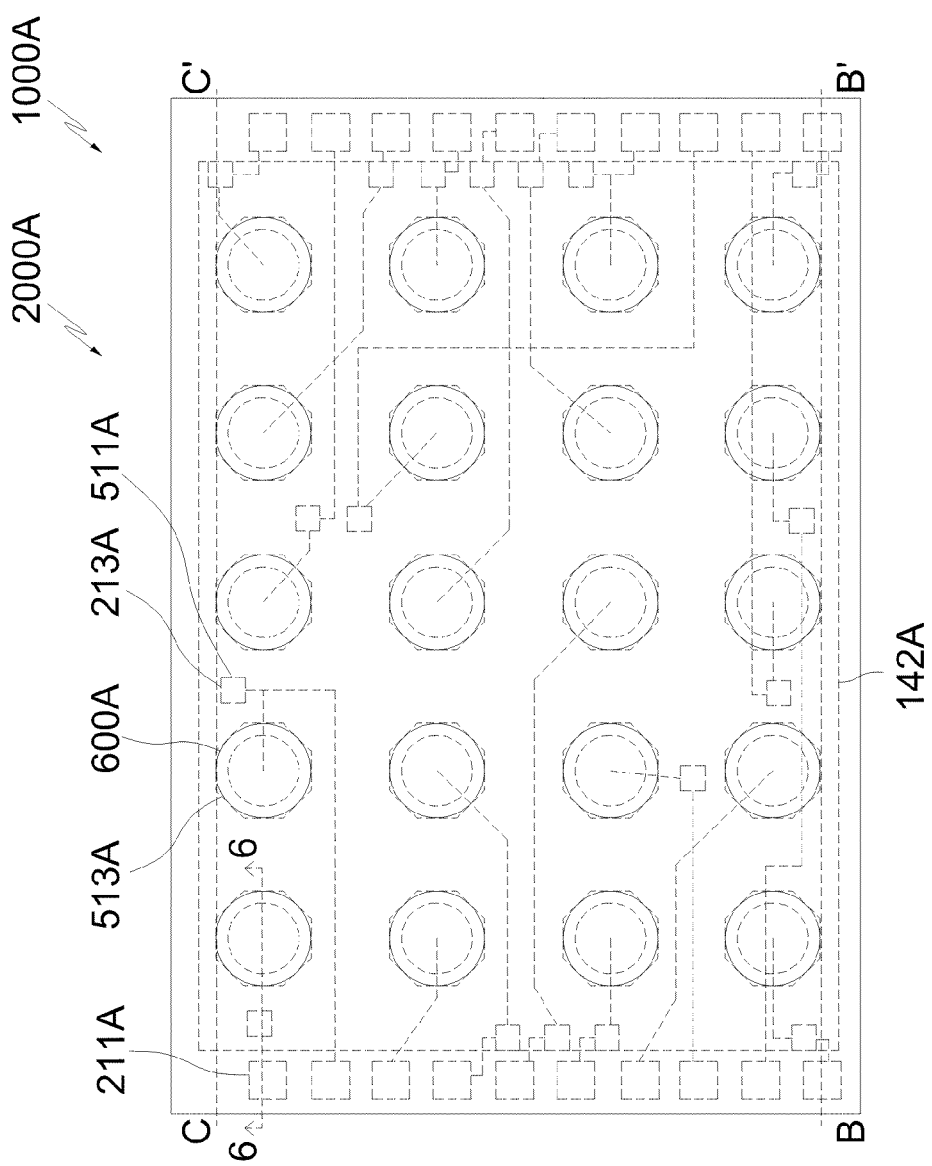
FIG. 7 is a plan view illustrating the exemplary semiconductor device of FIG. 6.

FIG. 6 is a cross-sectional view illustrating an exemplary semiconductor device 2000A packaged in accordance with a CSP type packaging method using the semiconductor element 1000A illustrated in FIG. 4. FIG. 7 is a plan view illustrating the exemplary semiconductor device 2000A. The sectional view of FIG. 6 corresponds to a sectional view taken along the line 6-6 in FIG. 7.

The exemplary semiconductor device 2000A illustrated in FIG. 6 includes a semiconductor element 1000A having a first semiconductor element portion 100A and a second semiconductor element portion 200A, a semiconductor device portion 500A, and an external connection terminal 600A.

In the exemplary embodiment, the first semiconductor element portion 100A has generally the same configuration as the first semiconductor element portion 100 of the semiconductor element 1000 illustrated in FIG. 1. The second semiconductor element portion 200A has generally the same configuration as the second semiconductor element portion 200A of the semiconductor element 1000A illustrated in FIG. 4.

In the exemplary embodiment, the semiconductor device portion 500A includes a rewiring layer 510A, a post 520A, and a sealing layer 530A. The rewiring layer 510A may be formed of copper and/or a copper alloy, for example. The rewiring layer 510A is configured to have a pad connection region 511A, a connection region 512A connected to the pad connection region 511A, and a post forming region 513A connected to the connection region 512A. The rewiring layer 510A is formed on the insulating layer 220A such that the pad connection region 511A is connected to the second pad 213A. The post forming region 513A extends to a position where the post 520A is formed. The post forming region 513A may have a polygonal shape or a circular shape having a diameter larger than that of the post 520A. In an embodiment, the post forming region 513A has an octagonal shape. In a device in which the post 520A has a cylindrical shape, the polygonal shape of the post forming region 513A may be modified to a polygonal shape having more sides than an octagon so that the size of the post forming region 513A approaches a planar size of the post 520A as viewed in top a view. It is therefore possible to form the post 520A in a small area. With the rewiring layer 510A, it is possible to arbitrarily set the position of the second pad 213A and the post 520A by using the wiring layer 210A of the semiconductor element 1000A and the rewiring layer 510A of the semiconductor device 2000A. That is, the position of the post forming region 513A relative to the position of the first pad 211A can be arbitrarily set by using the connection portion 212A and the connection region 512A.

In this embodiment, the resistance of the rewiring layer 510A is lower than the resistance of the wiring layer 210A. However, in a case of a terminal for inputting/outputting a reset signal or a data signal, since it only needs to be capable of reading values of 1 or 0, the connection region 512A may be shorter than the connection portion 212A, so that the resistance of the rewiring layer 510A may be increased.

Similarly, in a case of a terminal such as a source terminal or a ground terminal that needs to be maintained at a constant electric potential, since a voltage drop is not desirable, the length of the connection region 512A may be longer than the connection portion 212A, so that the resistance of the rewiring layer 510A may be decreased. In this manner, it is possible to adjust the resistance of regions ranging from the first pad 211A to the terminal by controlling the length of the connection portion 212A and the length of the connection region 512A depending on the function of the terminal.

In an embodiment, the post 520A is formed of copper and/or a copper alloy, for example. The post 520A has a cylindrical shape and is formed on the post forming region 513A of the rewiring layer 510A. The sealing layer 530A is formed of a polyimide resin, for example. The sealing layer 530A is formed on the insulating layer 220A and the rewiring layer 510A exposing an upper surface of the post 520A. The external connection terminal 600A is formed on the post 520A using a material such as a solder ball, for example.

FIG. 7 is a plan view of the exemplary semiconductor device 2000A illustrated in FIG. 6. In FIG. 7, portions covered by the sealing layer 530A and the external connection terminal 600A are illustrated by broken lines. As illustrated in FIG. 7, the external connection terminals 600A are arranged in a matrix at predetermined intervals. In FIG. 7, imaginary lines B-B' and C-C' are illustrated. These lines are illustrated in order to describe the positional relationship between the first pad 211A and the second pad 213A of the semiconductor element 1000A, and the pad connection region 511A and the post forming region 513A (beneath the external connection terminal 600A) of the semiconductor device 2000A. Specifically, the lines B-B' and C-C' are imaginary lines drawn to connect ends of the post forming regions 513A formed at an outermost region of the semiconductor device 2000A. As viewed along the line B-B', the first pad 211A, the second pad 213A, and the pad connection region 511A provided along an edge of the semiconductor device 2000A closest to the line B-B' are disposed on the line B-B' or farther away from an edge of the semiconductor device than the line B-B'. In this manner, the first pad 211A and the second pad 213A of the semiconductor element 1000A and the pad connection region 511A of the semiconductor device 2000A are disposed at an inner side of the later-formed post forming region 513A. The post forming region 513A can be disposed close to the edge of the semiconductor device 2000A as much as possible, which contributes to reduction in the size and an increase in the number of pins of the semiconductor device 2000A. Meanwhile, as viewed along the line C-C', the first pad 211A, the second pad 213A, and the pad connection region 511A are disposed at an inner side of the line C-C'. Thus, it is possible to contribute to further reduction in size and a further increase in the number of pins compared with the portion along the line B-B'. Such a configuration is not necessarily found on all four sides of the semiconductor element 1000A. In some embodiments, at least one side may not have such a configuration in order to allow an inspection process, such as probing. In an inspection process, it may be preferable for the pads to be formed in a semiconductor element are disposed closer to the outer periphery as much as possible. By employing such a configuration, it is possible to obtain a semiconductor element and a semiconductor device having a reduced size while allowing effective inspection.

Figure 8:
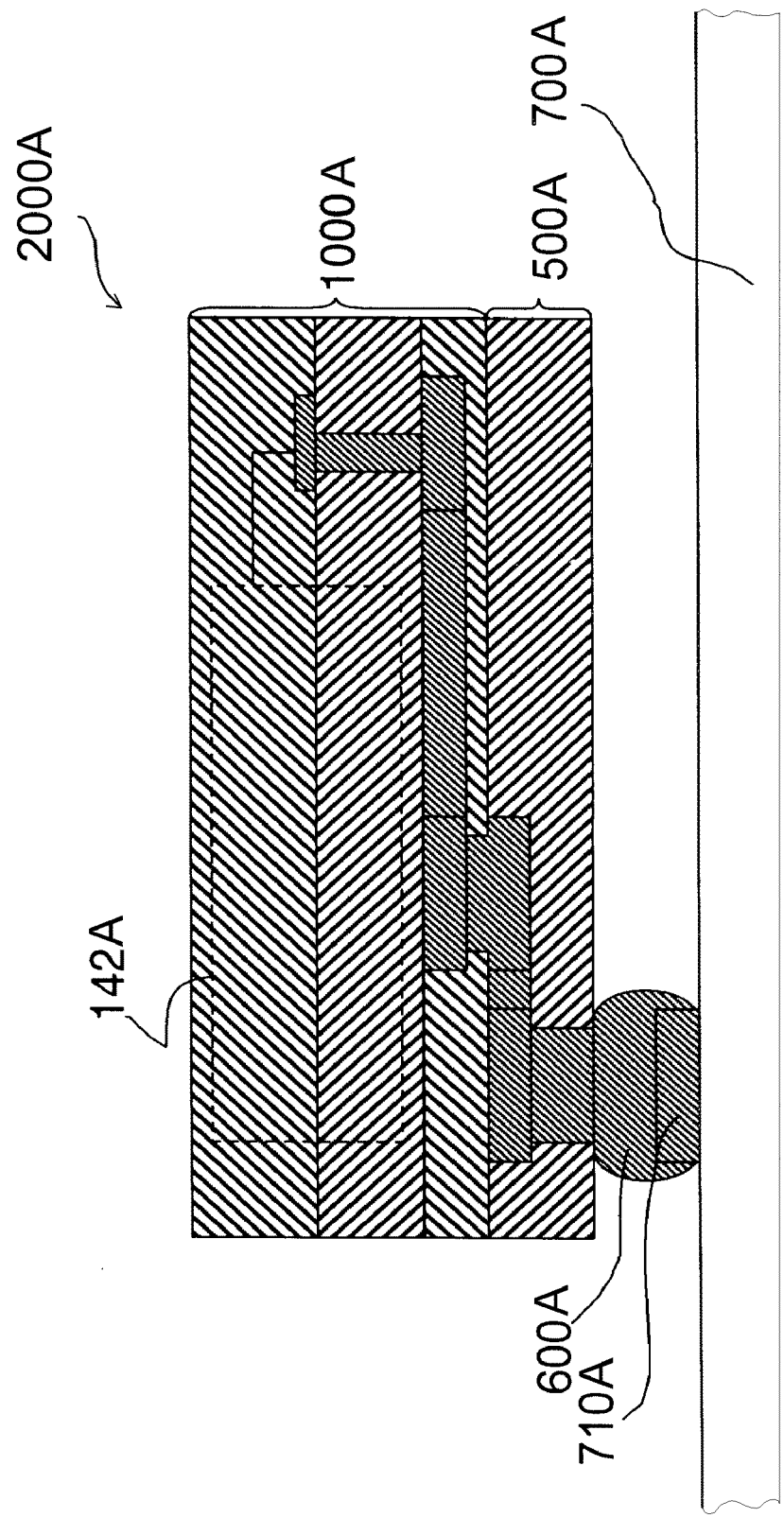
FIG. 8 is a schematic view illustrating an exemplary packaging method for the exemplary semiconductor device of FIG. 6.

FIG. 8 is a schematic view illustrating an exemplary packaging method for the exemplary semiconductor device 2000A illustrated in FIG. 6. In FIG. 8, the semiconductor device 2000A and a mounting substrate 700A for mounting the semiconductor device 2000A are illustrated. The semiconductor device 2000A includes the semiconductor element 1000A and a semiconductor device portion 500A, which is generally equivalent to the semiconductor device 2000A illustrated in FIG. 6. As illustrated in FIG. 8, the semiconductor device 2000A is connected to the mounting substrate 700A in a face-down manner. In this case, the external connection terminal 600A is connected to an electrode 710A of the mounting substrate 700A.

In this way, since a pad to be exposed is changed in accordance with a packaging method, it is possible to provide a semiconductor element and a semiconductor device capable of being used with a variety of packaging methods such as wire bonding type packaging method or a CSP type packaging method where connections are carried out in a face-down manner.

Figure 9:
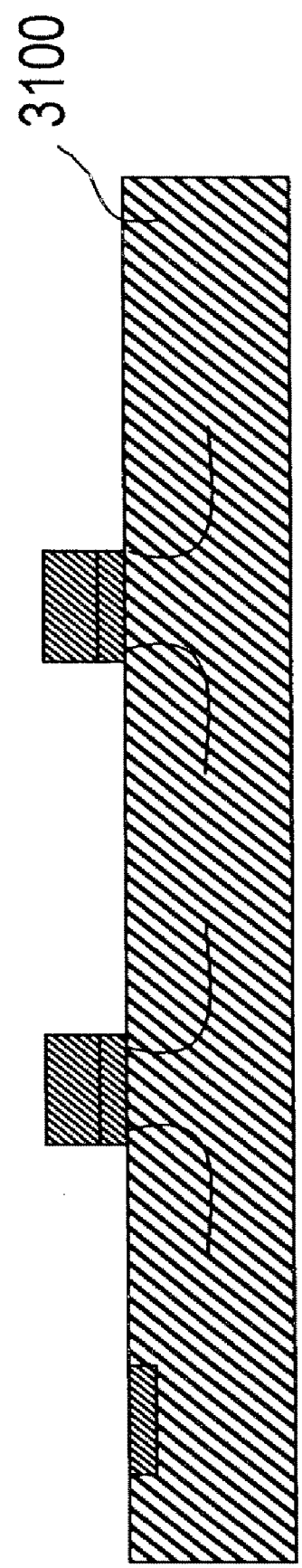
FIG. 9 is a cross-sectional view illustrating a step of an exemplary fabrication method.

A description of an exemplary fabrication method of an exemplary semiconductor element is provided below with reference to FIGS. 9 to 16. Referring to FIG. 9, one or more transistors, resistors, capacitors, and the like may be formed on a semiconductor layer 3100. The semiconductor layer 3100 is formed using a wafer appropriately selected from a silicon substrate wafer, a silicon on insulator ("SOI") substrate wafer, a compound semiconductor substrate wafer, and the like, and the transistors, resistors, capacitors, and the like are formed thereon by known methods.

Figure 10:
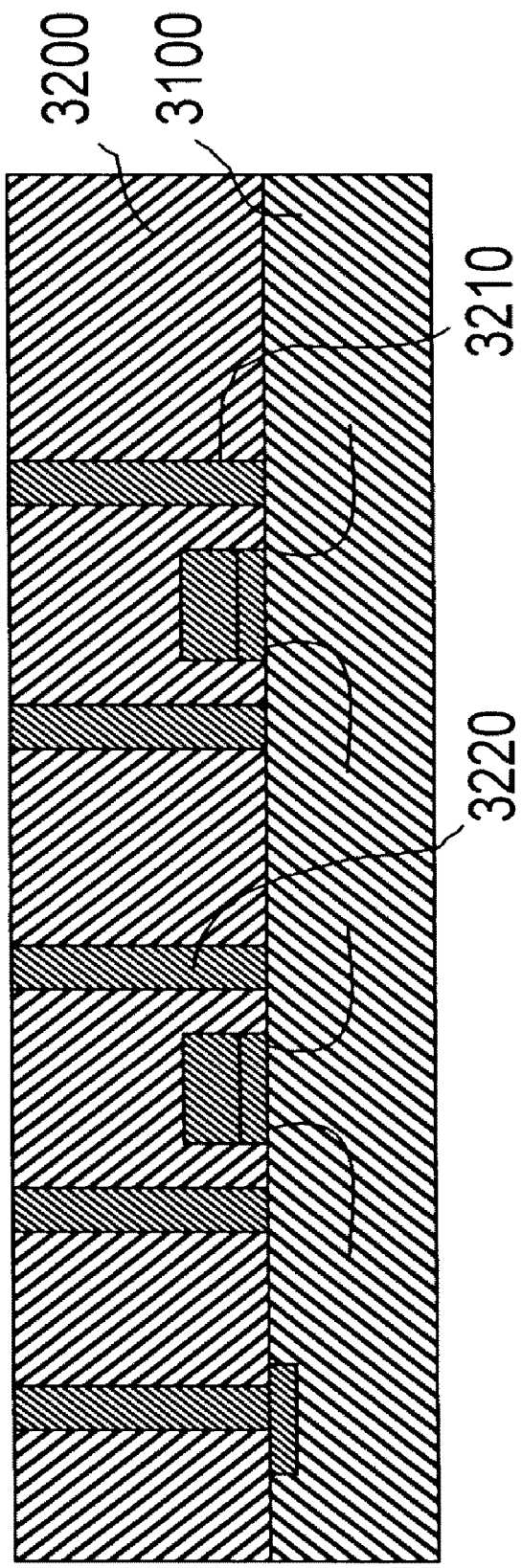
FIG. 10 is a cross-sectional view illustrating a step of an exemplary fabrication method.

Subsequently, as illustrated in FIG. 10, a first interlayer insulating film 3200 is formed on the semiconductor layer 3100. First contact holes 3210 are formed, and first contact electrodes 3220 are formed therein. The first interlayer insulating film 3200 is formed covering the transistors, resistors, capacitors, and the like formed on the semiconductor layer 3100. The first interlayer insulating film 3200 is formed of a material such as silicon oxide, polyimide, and/or a low-k insulating material using a CVD method or a coating method. After forming the first interlayer insulating film 3200, the first contact holes 3210 are formed at predetermined positions by a photolithography process. Then, the first contact electrodes 3220 are formed in the first contact holes 3210. The first contact electrodes 3220 are formed of a metal material such as aluminum, copper, and/or tungsten, and/or an alloy thereof using a CVD method or a sputtering method, for example.

Figure 11:
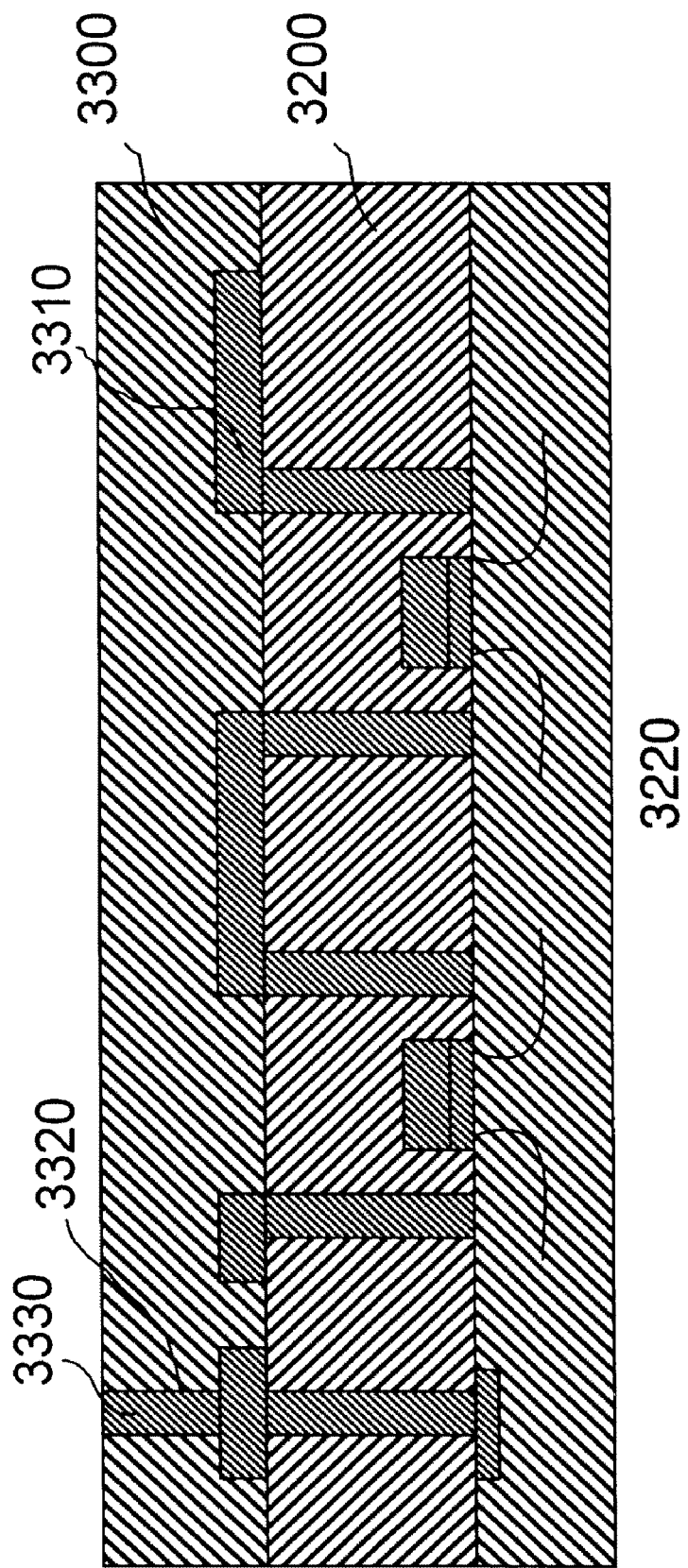
FIG. 11 is a cross-sectional view illustrating a step of an exemplary fabrication method.

Next, as illustrated in FIG. 11, a second interlayer insulating film 3300, first internal wirings 3310, a second contact hole 3320, and a second contact electrode 3330 are formed on the first interlayer insulating film 3200. The first internal wirings 3310 are formed on the first interlayer insulating film 3200 using a material selected from the conductive materials discussed above as possible materials for the first contact electrodes 3320. The second interlayer insulating film 3300 is formed on the first interlayer insulating film 3200 and the first internal wirings 3310 using a material selected from the insulating materials discussed above as possible materials for the first interlayer insulating film 3200. After forming the second interlayer insulating film 3300, the second contact hole 3320 is formed at a predetermined position by a photolithography process or the like. Then, the second contact electrode 3330 is formed in the second contact hole 3320 in a manner similar to the first contact electrodes 3220.

Figure 12:
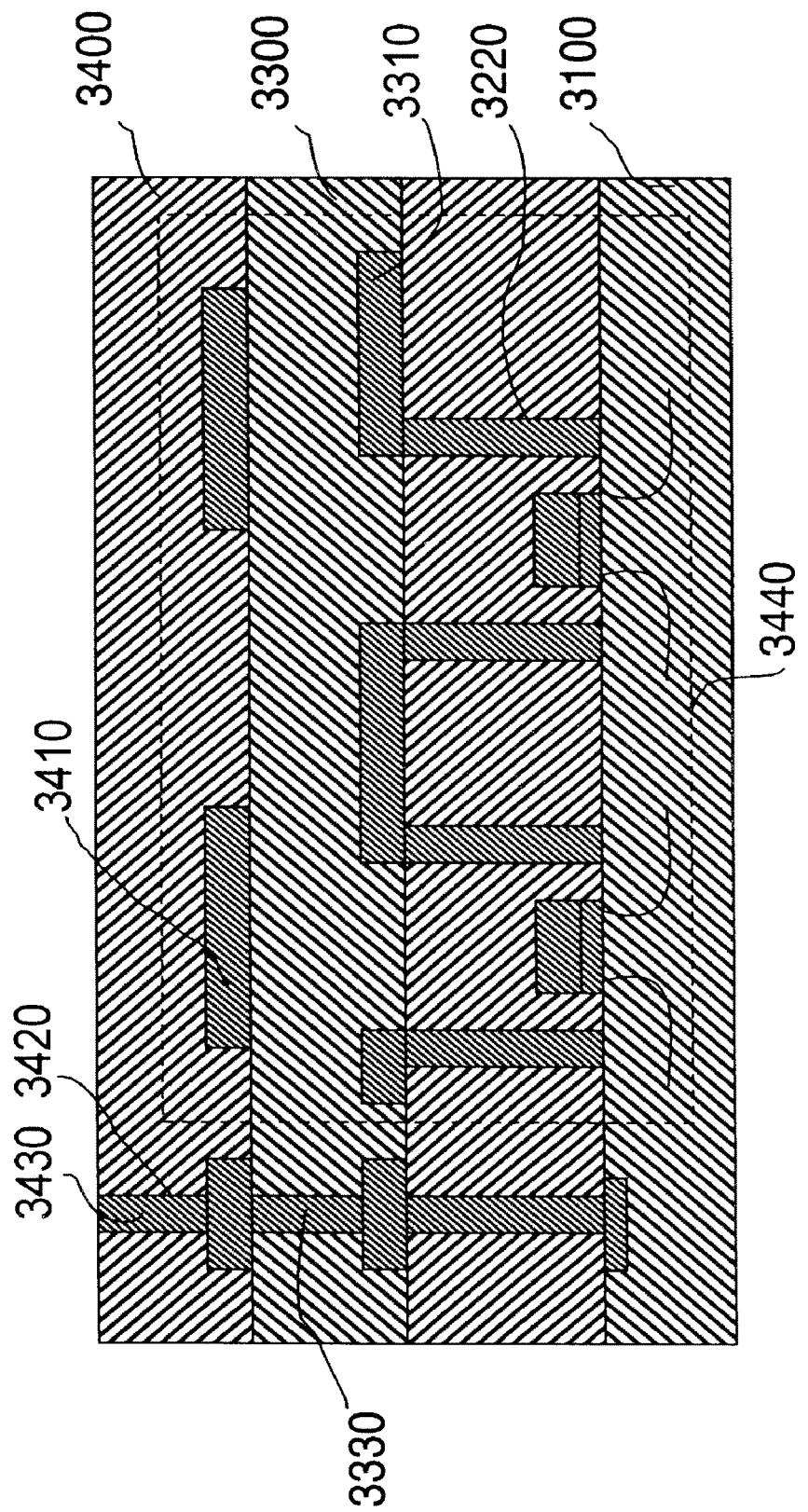
FIG. 12 is a cross-sectional view illustrating a step of an exemplary fabrication method.

Subsequently, as illustrated in FIG. 12, a third interlayer insulating film 3400, second internal wirings 3410, a third contact hole 3420, and a third contact electrode 3430 are formed on the second interlayer insulating film 3300. The second internal wirings 3410 are formed on the second interlayer insulating film 3300 using a material selected from the conductive materials discussed above as possible materials for the first contact electrodes 3320. The third interlayer insulating film 3400 is formed on the second interlayer insulating film 3300 and the second internal wirings 3410. After forming the third interlayer insulating film 3400A, the third contact hole 3420 is formed at a predetermined position by a photolithography process or the like. Then, the third contact electrode 3430 is formed in the third contact hole 3420 in a manner similar to the first contact electrodes 3220. In this way, an internal circuit 3440 is formed by the transistors and the like formed on the semiconductor layer 3100, the first contact electrodes 3320, the first internal wirings 3310, the second contact electrodes 3330, and the second internal wirings 3410.

Figure 13:
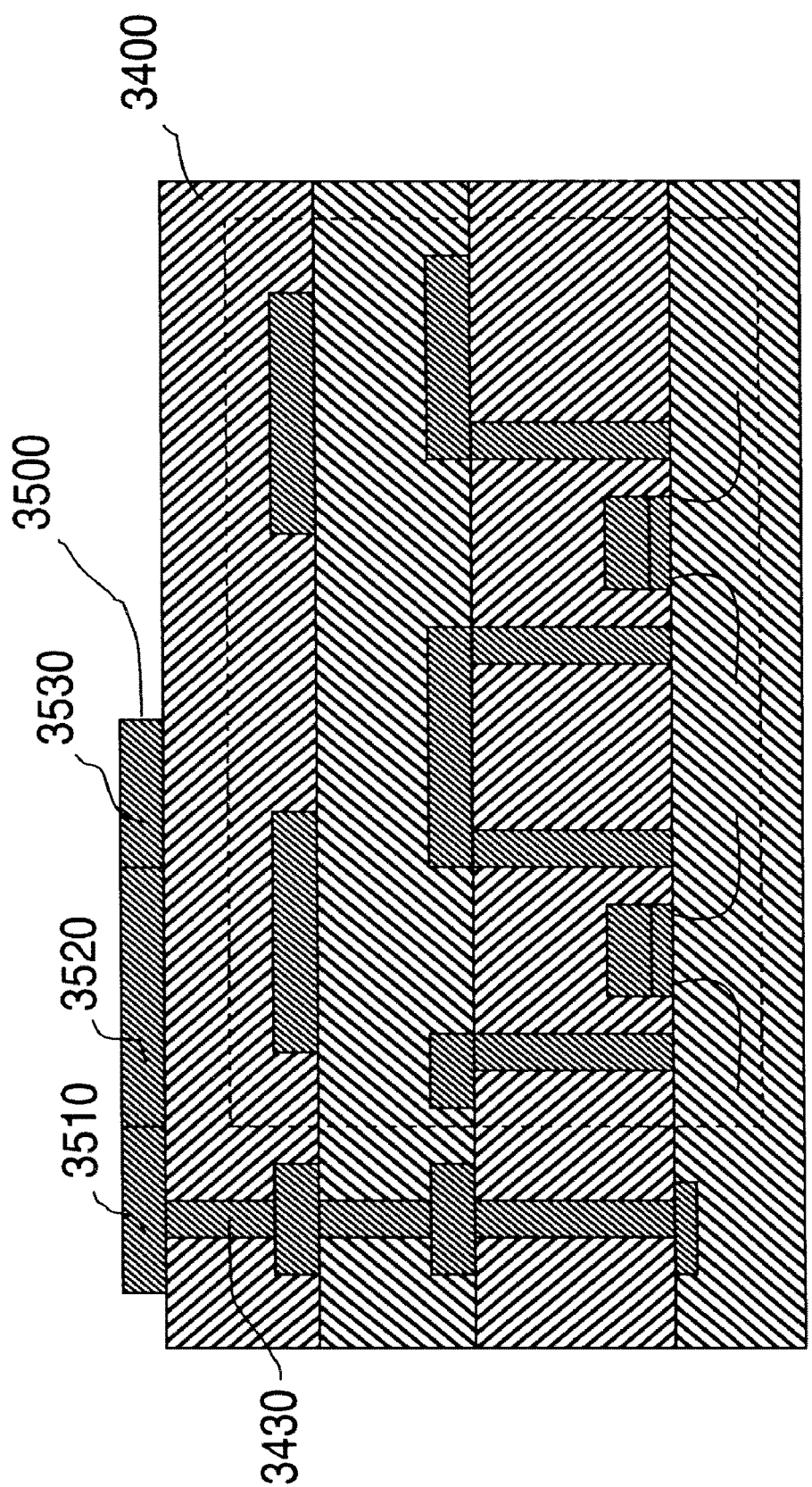
FIG. 13 is a cross-sectional view illustrating a step of an exemplary fabrication method.

Next, as illustrated in FIG. 13, a wiring layer 3500 is formed on the third interlayer insulating film 3400. The wiring layer 3500 is configured to include a first pad 3510 formed on the third contact electrode 3430, a connection portion 3520 connected to the first pad 3510, and a second pad 3530 connected to the connection portion 3520. The wiring layer 3500 is formed by a photolithography process or the like using a material selected from the conductive materials discussed above as possible materials for the first contact electrodes 3320.

Figure 14:
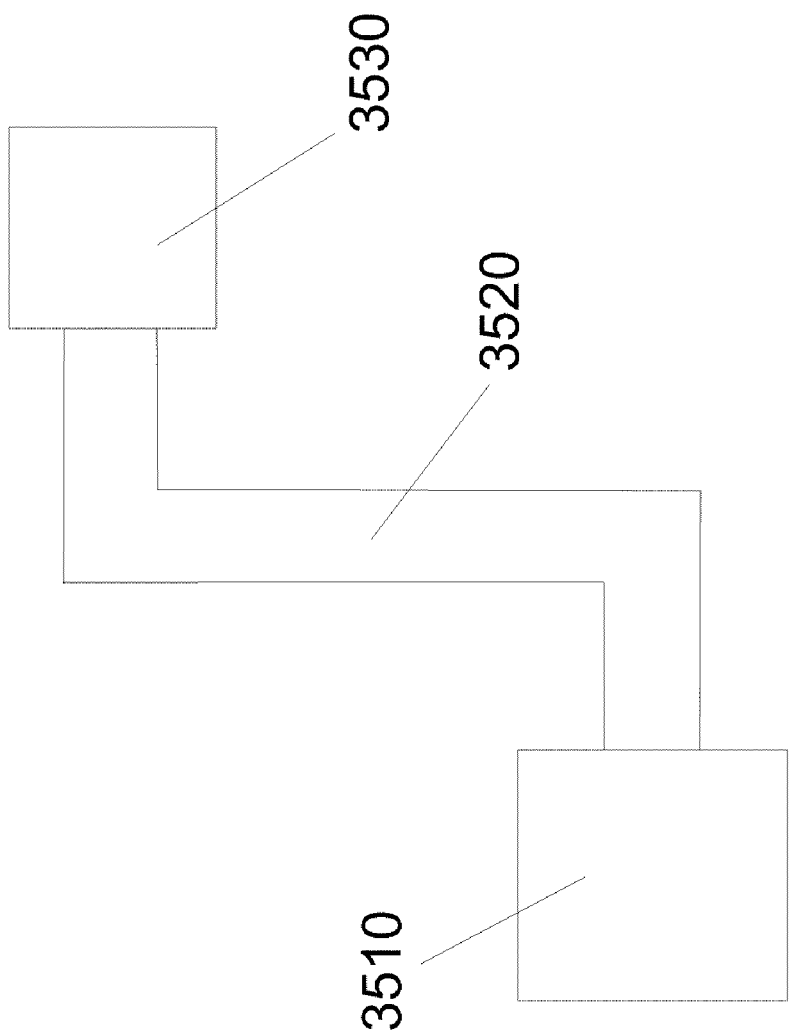
FIG. 14 is a plan view of an exemplary wiring layer.

FIG. 14 is a plan view of the wiring layer 3500 of FIG. 13. As will be understood from FIG. 14, the first pad 3510 and the second pad 3530 are connected by the connection portion 3520. In this case, by changing the shape of the connection portion 3520 using a mask used in the photolithography process or the like, the second pad 3530 can be disposed at an arbitrary position.

Figure 15:
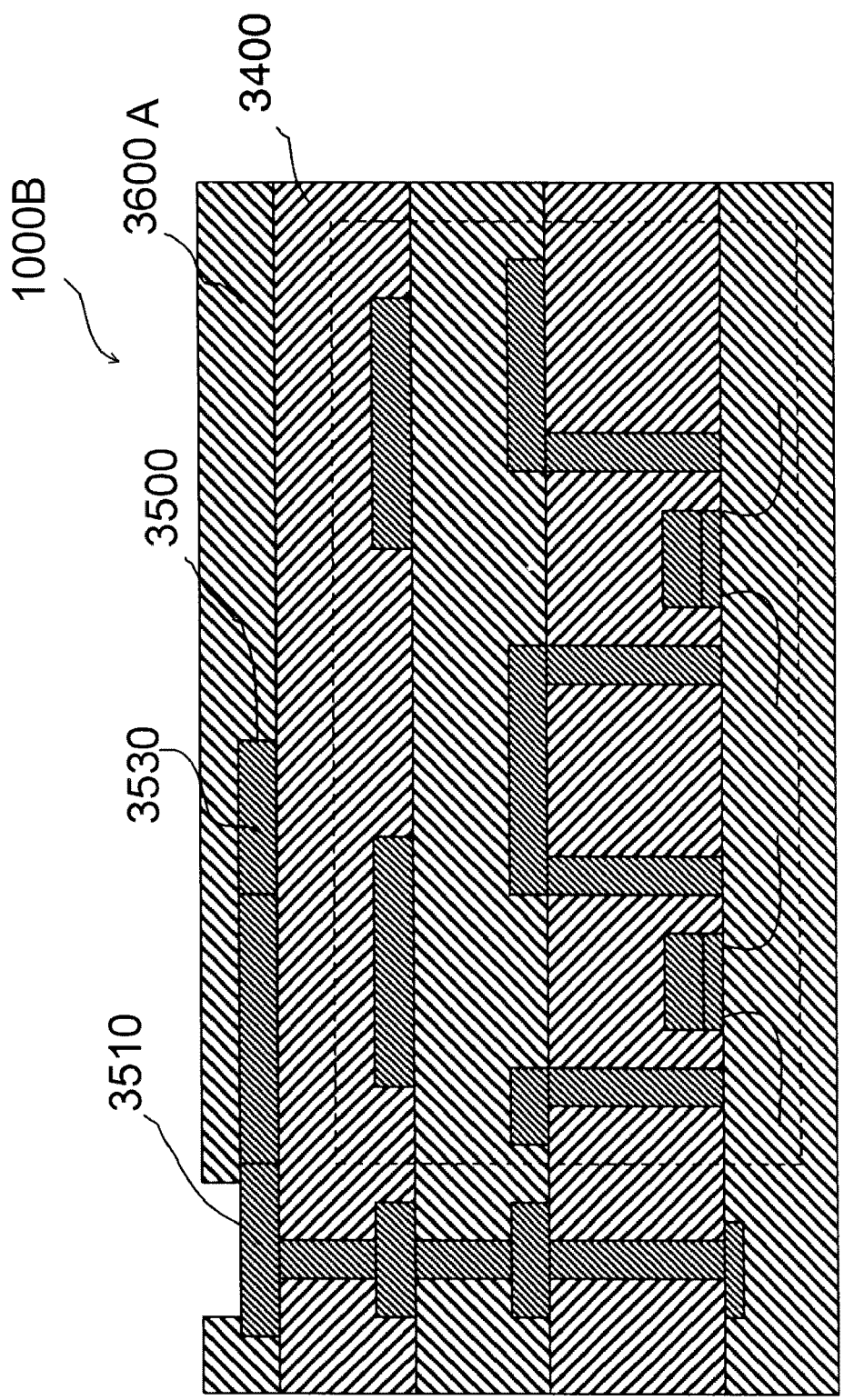
FIG. 15 is a cross-sectional view illustrating a step of an exemplary fabrication method.
Figure 16:
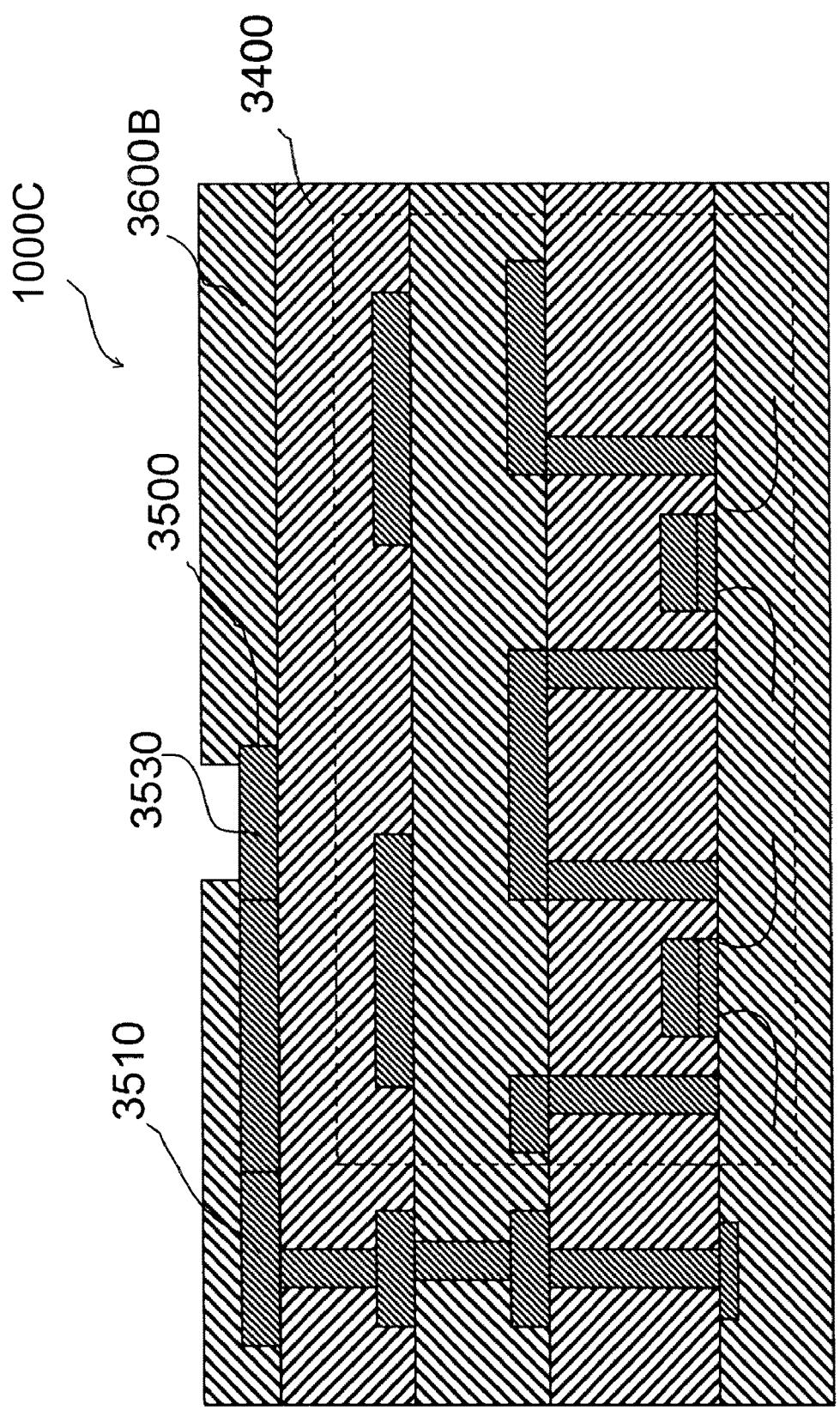
FIG. 16 is a cross-sectional view illustrating a step of an exemplary fabrication method.

Next, as illustrated in FIGS. 15 and 16, an insulating film 3600 is formed on the third interlayer insulating film 3400 and the wiring layer 3500. The insulating film 3600 is formed by a coating method using an insulating material, such as polyimide. Specifically, an insulating material is deposited on the third interlayer insulating film 3400 and the wiring layer 3500. A portion of the insulating material is removed by a photolithography process or the like, so that the insulating film 3600A exposing the first pad 3510 (as illustrated in FIG. 15) or the insulating film 3600B exposing the second pad 3530 (as illustrated in FIG. 16) is formed. In this case, a determination as to whether the etching results in the insulating film 3600A illustrated in FIG. 15 or the insulating film 3600B illustrated in FIG. 16 is made depending on an intended packaging method. Specifically, in the case of a wire bonding type packaging, the etching is performed to produce the insulating film 3600A exposing the first pad 3510, while in the case of a CSP type packaging, the etching is performed to produce the insulating film 3600B exposing the second pad 3530. To accomplish this, two photomasks, one having mask patterns for forming the insulating film 3600A illustrated in FIG. 15 and one having mask patterns for forming the insulating film 3600B illustrated in FIG. 16, are prepared and, upon selection of a packaging method, one of the photomasks is selected for use. A portion of the insulating material is removed and, thus, a semiconductor element corresponding to the selected packaging method fabricated.

In this manner, by appropriately selecting the insulating layer 3600A, 3600B, it is possible to provide a semiconductor element capable of being used for different packaging methods. In other words, it is not necessary to make a determination as to a packaging method until the step of forming the insulating layer 3600A, 3600B, and a packaging method can be freely changed in the course of fabrication of the semiconductor element. Moreover, since the insulating material is formed in order to protect the semiconductor element, it is possible to store a sufficient amount of semiconductor wafers in stock in a state where the process step has proceeded to the insulating material forming step. Therefore, it is possible to supply a semiconductor element corresponding to a packaging method demanded by a client in a short time. In the case of the semiconductor element 1000B illustrated in FIG. 15, after forming the insulating layer 3600A, the semiconductor element 1000B may be obtained by dividing individual elements using a laser or a dicing saw. In the case of the semiconductor element 1000C illustrated in FIG. 16, a CSP type semiconductor device 2000B is formed through process steps described below.

An exemplary fabrication method of fabricating the CSP type semiconductor device 2000B from the semiconductor element 1000C illustrated in FIG. 16 refers to FIGS. 17 to 20. The following steps are described as being a wafer-level chip-scale package ("WCSP") where the steps are performed on the semiconductor element in a wafer state.

Figure 17:
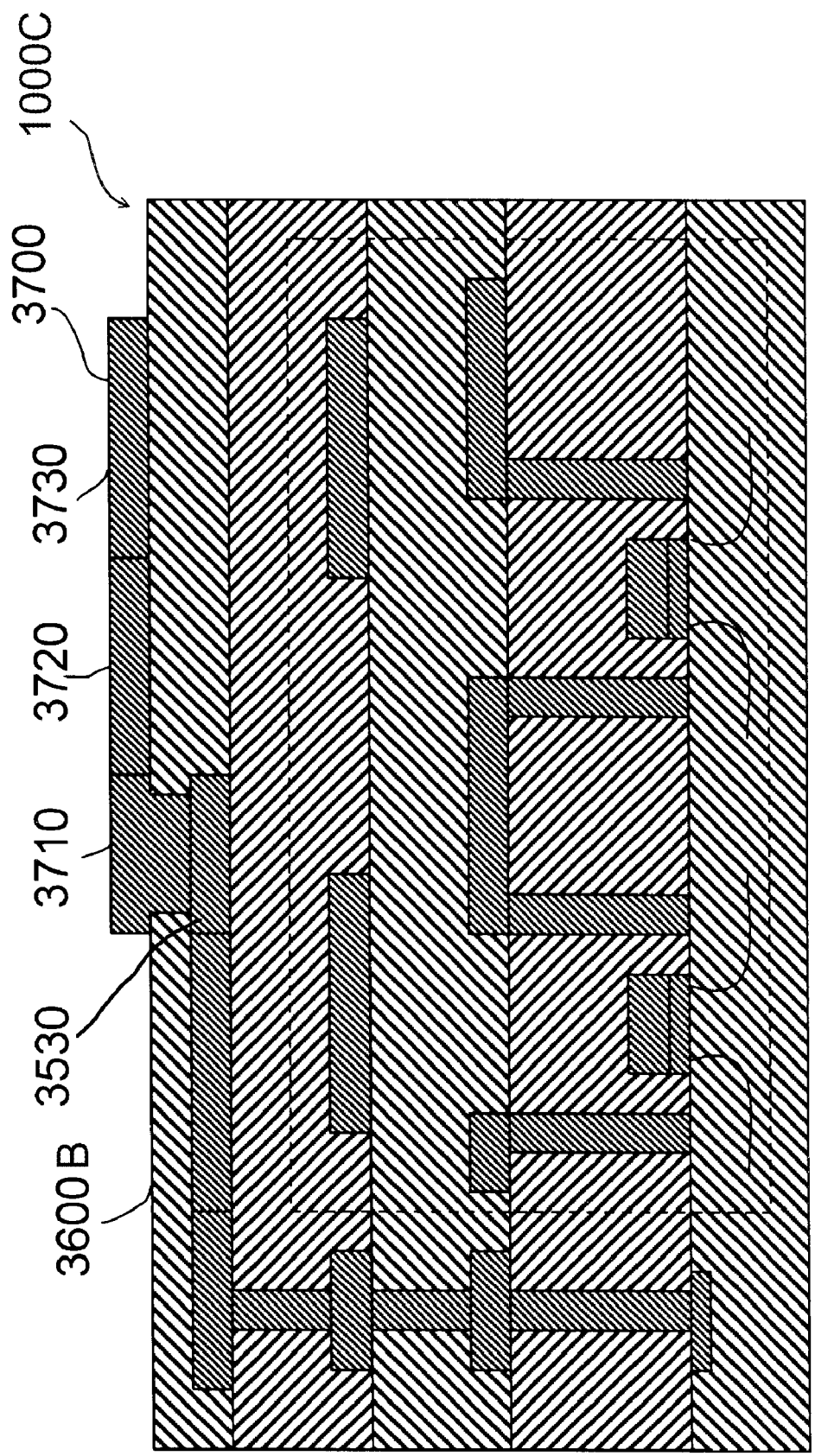
FIG. 17 is a cross-sectional view illustrating a step of an exemplary fabrication method.
Figure 18:
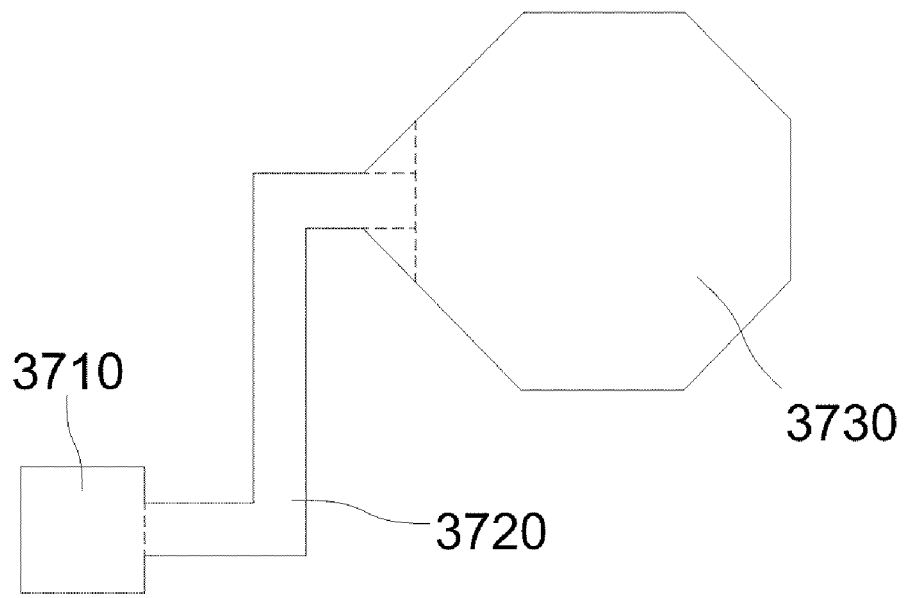
FIG. 18 is a plan view of an exemplary rewiring layer.

As illustrated in FIGS. 17 and 18, a rewiring layer 3700 is formed on the insulating layer 3600B of the semiconductor element 1000C. The rewiring layer 3700 is formed by a plating method using copper and/or a copper alloy, for example. The rewiring layer 3700 includes a pad connection region 3710 connected to the second pad 3530 of the semiconductor element, a connection region 3720 connected to the pad connection region 3710, and a post forming region 3730 connected to the connection region 3720.

FIG. 18 is a plan view of the rewiring layer 3700. As illustrated in FIG. 18, the post forming region 3730 is larger than the pad connection region 3710, and the post forming region 3730 has a generally octagonal shape. This is because the post forming region 3730 is larger than the diameter of a post (described below) and because the post has a larger cross section than the post forming region 3730. Moreover, a connection portion of the connection region 3720 and the post forming region 3730 may be configured such that the connection region 3720 is connected at or near the center of one side of the post forming region 3730. Alternatively, in order to avoid concentration of thermal stress or the like on the semiconductor device, the connection region 3720 may be formed such that the width of the connection region 3720 gradually increases moving towards the post forming region 3730, so that the width in the connection portion gradually increases to the same width as one side of the post forming region 3730.

Figure 19:
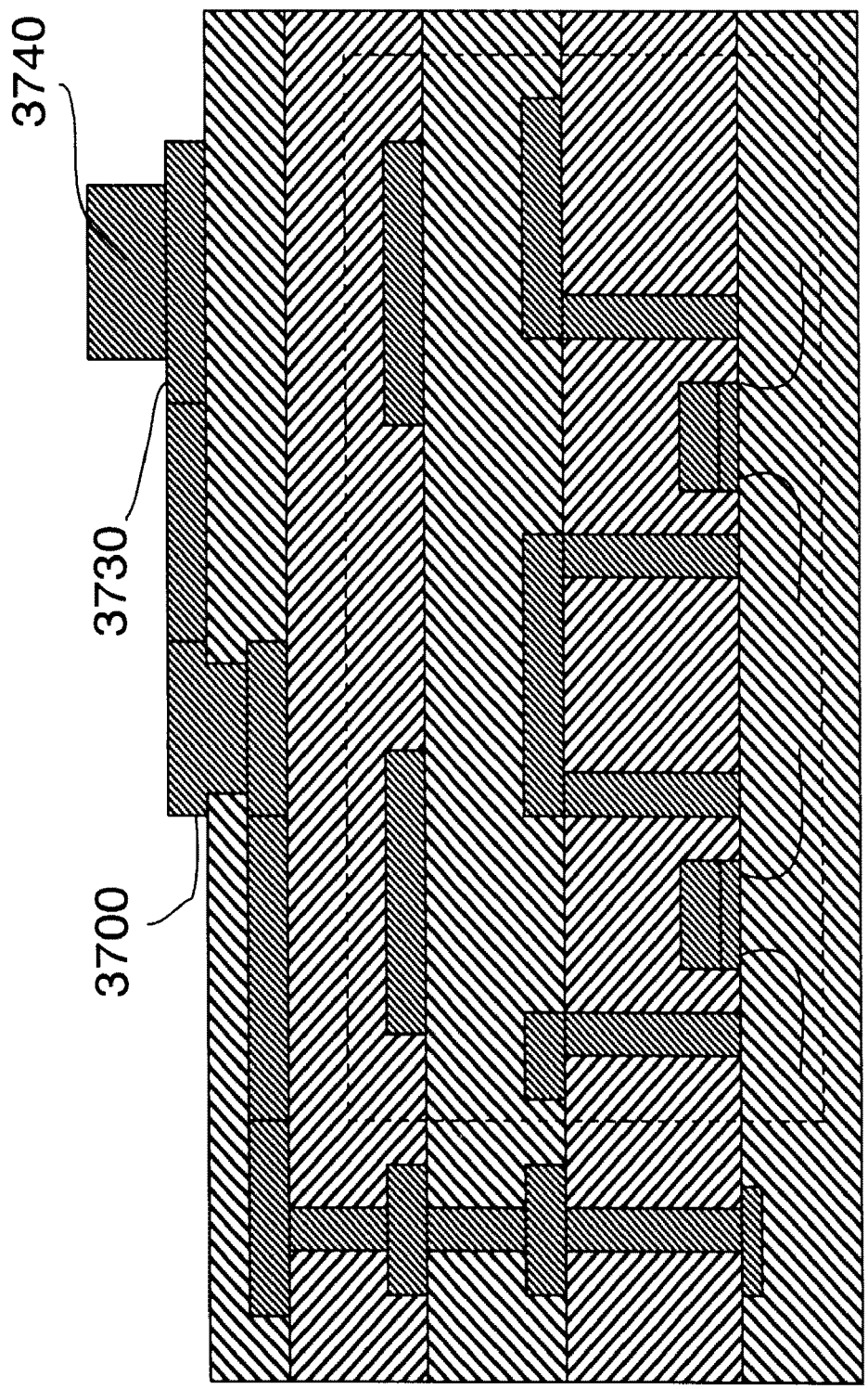
FIG. 19 is a cross-sectional view illustrating a step of an exemplary fabrication method.

Next, as illustrated in FIG. 19, the post 3740 is formed on the post forming region 3730 of the rewiring layer 3700. The post 3740 is formed by a plating method using a material selected from the materials discussed above as possible materials for the rewiring layer 3700.

Figure 20:
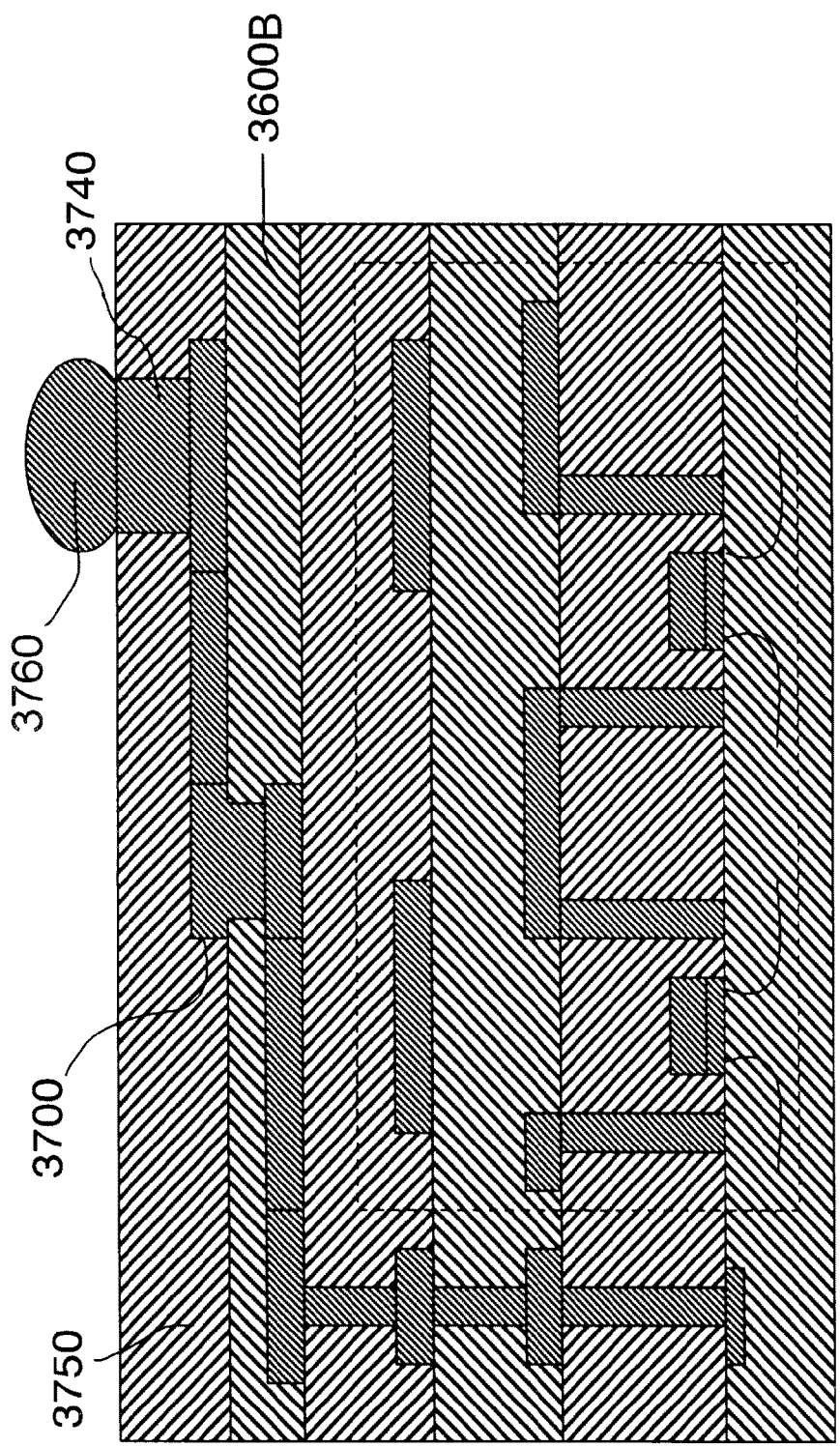
FIG. 20 is a cross-sectional view illustrating a step of an exemplary fabrication method.

Next, as illustrated in FIG. 20, a sealing layer 3750 is formed on the insulating layer 3600B and the rewiring layer 3700 exposing an upper surface of the post 3740, and an external connection terminal 3760 is formed on an upper surface of the post 3740. The sealing layer 3750 is formed by a coating method or a die molding method using a polyimide resin or the like. The sealing layer 3750 may be formed so as to cover the side surfaces of the insulating layer 3600B, the rewiring layer 3700, and/or the post 3740.

Although the sealing layer 3750 has been described as being formed after the post 3740 has been formed, in some embodiments the post 3740 may be formed after the sealing layer 3750 has been formed. In such a case, after forming the sealing layer 3750 on the insulating layer 3600B and the rewiring layer 3700, an opening is formed in the sealing layer 3750 extending to the rewiring layer 3740, and a conductive material is deposited in the opening, thereby forming the post 3740.

The external connection terminal 3760 is formed on the post 3740 using a material such as a solder ball or a pin. If a solder ball is used, it may be mounted directly on the post. Alternatively, a solder paste may be applied to the post and may then be heated so that the terminal is formed in a self-aligned manner.

In this manner, the above-described process steps are performed in a wafer state, and the semiconductor device 2000B is obtained by dividing the wafer into individual devices using a laser or a dicing saw.

While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages of the may exist even though they may not have been explicitly discussed herein.

What is claimed is:

1. A semiconductor device comprising:
    a first semiconductor element portion including an internal circuit, electrodes electrically connected to the internal circuit, and a first insulating layer covering the internal circuit while exposing the electrodes;
    a second semiconductor element portion electrically connected to the electrodes and formed over the first insulating layer, the second semiconductor element portion including a wiring layer having a first pad and a second pad, and a second insulating layer covering one of the first pad and the second pad while exposing the other of the first pad and the second pad;
    a semiconductor device portion on the second insulating layer including a rewiring layer connected to the exposed first pad or second pad, a post formed on the rewiring layer electrically connected the rewiring layer, and a sealing layer formed on the second insulating layer exposing at least a portion of the post.

2. The semiconductor device of claim 1,
    wherein the pad and the second pad are formed on an upper surface of the first insulating layer, and
    wherein the second pad is disposed closer to an inner portion of the semiconductor element than the first pad.

3. The semiconductor device of claim 2, wherein the second pad is disposed above the internal circuit.

4. The semiconductor device of claim 3, wherein the first pad is located near at least one edge of the semiconductor device.

5. The semiconductor device of claim 4,
    wherein the wiring layer includes a connection portion connecting the first pad and the second,
    wherein the rewiring layer includes a pad connection region connected to the first pad, a connection region connected to the pad connection region, and a post forming region connected to the connection region, and
    wherein the wiring layer and the rewiring layer electrically connected to the first pan used for inputting or outputting a data signal are designed such that a length of the connection region of the rewiring layer is shorter than a length of the connection portion of the wiring layer.

6. The semiconductor device of claim 4,
    wherein the wiring layer includes a connection portion for connecting the first pad and the second pad, wherein the rewiring layer includes a pad connection region connected to the first pad, a connection region connected to the pad connection region, and a post forming region connected to the connection region, and wherein the wiring layer and the rewiring layer electrically connected to the first pad used for the supply of a source voltage or a round voltage are designed such that a length of the connection region of the rewiring layer is longer than a length of the connection portion of the wiring layer.

7. The semiconductor device of claim 4, wherein a plurality of posts are regularly arranged along a periphery of the semiconductor device, and wherein the first pad and the second pad are disposed on an imaginary straight line connecting ends of posts arranged along one side of the semiconductor device or inward of the imaginary straight line.

8. The semiconductor device of claim 1, wherein the second pad is disposed above the internal circuit.

9. The semiconductor device of claim 1, wherein the first pad is located near at least one edge of the semiconductor device.

10. The semiconductor device of claim 1, wherein the wiring layer includes a connection portion connecting the first pad and the second pad, wherein the rewiring layer includes a pad connection region connected to the first pad, a connection region connected to the pad connection region, and a post forming region connected to the connection region, and wherein the wiring layer and the rewiring layer electrically connected to the first pad used for inputting or outputting a signal are designed such that a length of the connection region of the rewiring layer is shorter than a length of the connection portion of the wiring layer.

11. The semiconductor device of claim 1 wherein the wiring layer includes it connection portion for connecting the first pad and the second pad, wherein the rewiring layer includes a connection region connected to the first Pad, a connection region connected to the pad connection region, and a post forming region connected to the connection region, and wherein the wiring layer and the rewiring layer electrically connected to the first pad used for the supply of a source voltage or a ground voltage are designed such that a length of the connection region of the rewiring layer is longer than a length or the connection portion of the wiring layer.

12. The semiconductor device of claim 1, wherein to plurality of posts are regularly arranged along a periphery of the semiconductor device, and wherein the first pad and the second pad are disposed on an imaginary straight line connecting ends of posts arranged along one side of the semiconductor device or inward from the imaginary straight line.

13. The semiconductor device of claim 1, wherein the second insulating layer exposes the second pad and covers the first pad; and wherein the semiconductor device is adapted for a chin scale packaging method.

* * * * *